(12) United States Patent
Tsang

(10) Patent No.: US 6,555,410 B2
(45) Date of Patent: Apr. 29, 2003

(54) PHOTODETECTOR AND DEVICE EMPLOYING THE PHOTODETECTOR FOR CONVERTING AN OPTICAL SIGNAL INTO AN ELECTRICAL SIGNAL

(75) Inventor: Koon Wing Tsang, Fremont, CA (US)

(73) Assignee: Capella Microsystems, Inc., San Jose, CA (US)

( * ) Notice: Subject to any disclaimer, the term of this patent is extended or adjusted under 35 U.S.C. 154(b) by 0 days.

(21) Appl. No.: 09/778,372

(22) Filed: Feb. 7, 2001

(65) Prior Publication Data

US 2001/0010943 A1 Aug. 2, 2001

Related U.S. Application Data

(60) Division of application No. 09/234,015, filed on Jan. 19, 1999, now Pat. No. 6,218,719, which is a continuation-in-part of application No. 09/156,872, filed on Sep. 18, 1998, now abandoned.

(51) Int. Cl.[7] .................. H01L 21/00; H01L 21/336; H01L 21/339; H01L 21/3203

(52) U.S. Cl. .................. 438/69; 438/287; 438/144; 438/591

(58) Field of Search ................ 438/69, 70, 71, 438/72, 287, 591, 144, 145, 146, 147, 148

(56) References Cited

U.S. PATENT DOCUMENTS

| | | | |
|---|---|---|---|
| 3,996,461 A | | 12/1976 | Sulzbach et al. |
| 4,606,115 A | | 8/1986 | Kervin et al. |
| 4,631,417 A | * | 12/1986 | Brilman ...................... 250/578 |
| 4,668,971 A | * | 5/1987 | Hynecek ...................... 357/24 |

(List continued on next page.)

FOREIGN PATENT DOCUMENTS

JP 404196169 A * 7/1992

OTHER PUBLICATIONS

Dorf, Richard C., Editor–in–Chief, "SI–OEIC (OPIC) for Optical Pickup," *The Electrical Engineering Handbook*, CRC Press, 1993, pp. 458, 752–753.
Fukunaga, Naoki et al., I–OEIC (OPIC) for Optical Pickup, *IEEE Transactions on Consumer Electronics*, vol. 43, No. 2, May 1997, pp. 157–164.

(List continued on next page.)

*Primary Examiner*—John F. Niebling
*Assistant Examiner*—Victor Simkovic
(74) *Attorney, Agent, or Firm*—James S. Hsue

(57) ABSTRACT

An anti-reflective coating having a composite layer of silicon nitride and silicon dioxide may be formed over the entire photosensitive region of the photodetector to minimize the amount of reflection. The composite layer comprises a silicon nitride layer and a dielectric layer contiguous to the silicon nitride layer. The anti-reflective coating may be formed in a CMOS process for fabricating the PN junction in the photodiode and CMOS devices for amplifying the photodetector signal, where the polysilicon gate layer is used as a etch stop. The P+ or N+ material in the PN junction of the photodiode has a distributed design where two portions of the region are separated by a distance in the range of Xd to 2Xd, where Xd is the one-sided junction depletion width, to enhance the electric field and to reduce the distance traveled by the carriers for enhancing bandwidth. A heavily doped region of the opposite type may be added between the two portions to further enhance the electric field. A mask is used to shield a portion of the substrate in which the photodetector region has been or is to be formed when other portions of the substrate region are implanted with a dopant to adjust at least one of the threshold voltages of the other portions. The mask prevents the photodetector region from being affected by such implant.

9 Claims, 25 Drawing Sheets

U.S. PATENT DOCUMENTS

| | | | |
|---|---|---|---|
| 4,903,103 A | | 2/1990 | Yamashita et al. |
| 5,162,887 A | | 11/1992 | Dierschke |
| 5,177,581 A | | 1/1993 | Kubo et al. |
| 5,242,839 A | * | 9/1993 | Oh et al. .................. 437/5 |
| 5,466,962 A | | 11/1995 | Yamamoto et al. |
| 5,576,239 A | * | 11/1996 | Hatano et al. ............ 437/53 |
| 5,767,555 A | | 6/1998 | Sakano et al. |
| 5,994,753 A | * | 11/1999 | Nitta ..................... 257/471 |
| 6,281,034 B1 | * | 8/2001 | Sugimoto et al. .......... 438/71 |

OTHER PUBLICATIONS

Takimoto, Takahiro et al., "High Speed SI–OEIC (OPIC) for Optical Pickup," *IEEE Transactions on Consumer Electronics*, vol. 44, No. 1, Feb. 1998, pp. 137–142.

"Applications of Silicon Photodiodes," Optoelectronic Components catalog produced by UDT Sensors, Inc., Hawthorne, CA 90250 pp. 3–9.

* cited by examiner

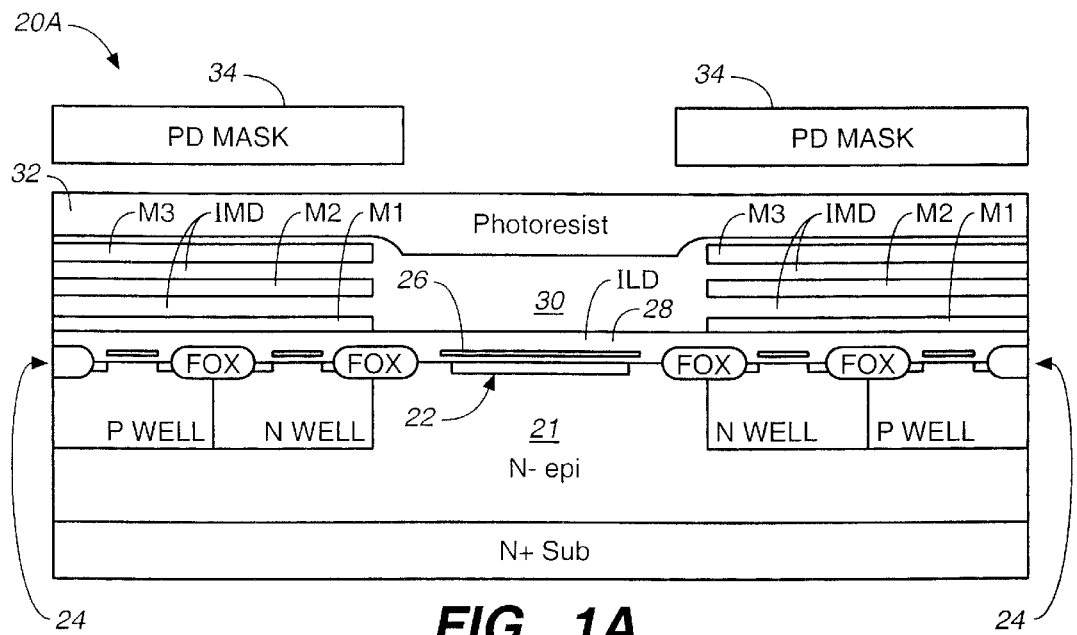
FIG._1A
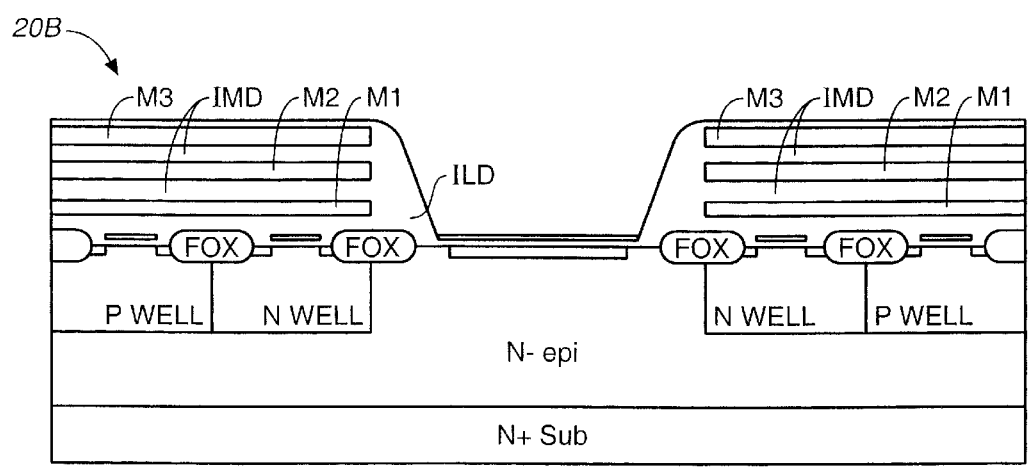
FIG._1B

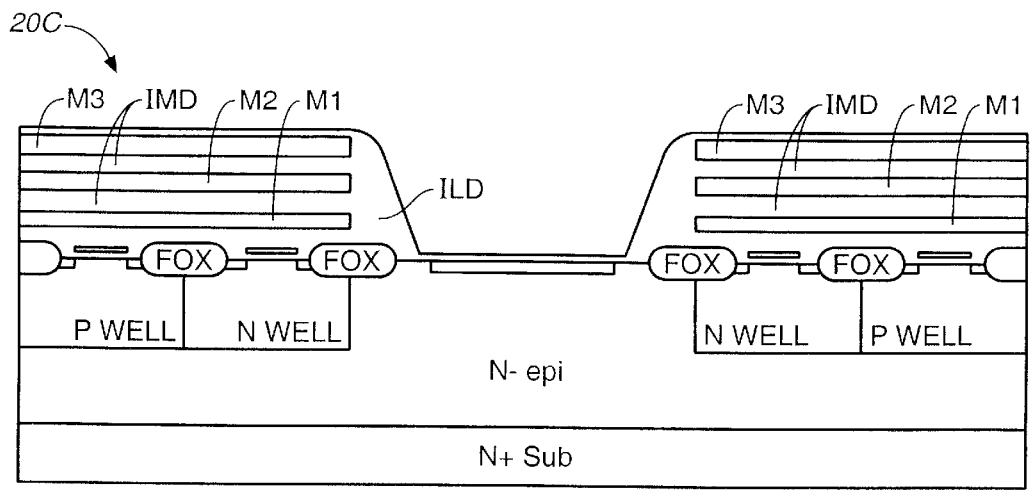
FIG._1C
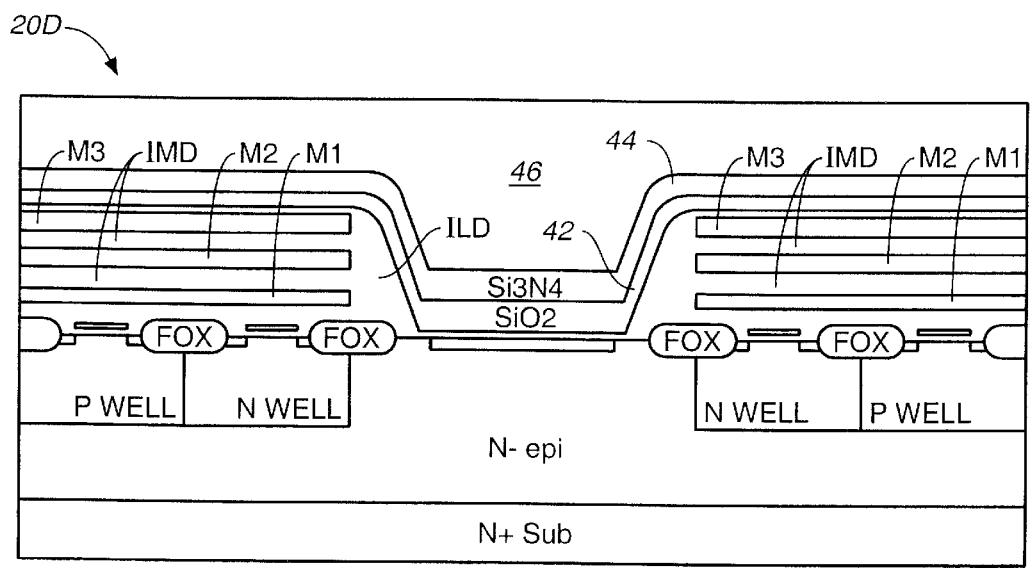
FIG._1D

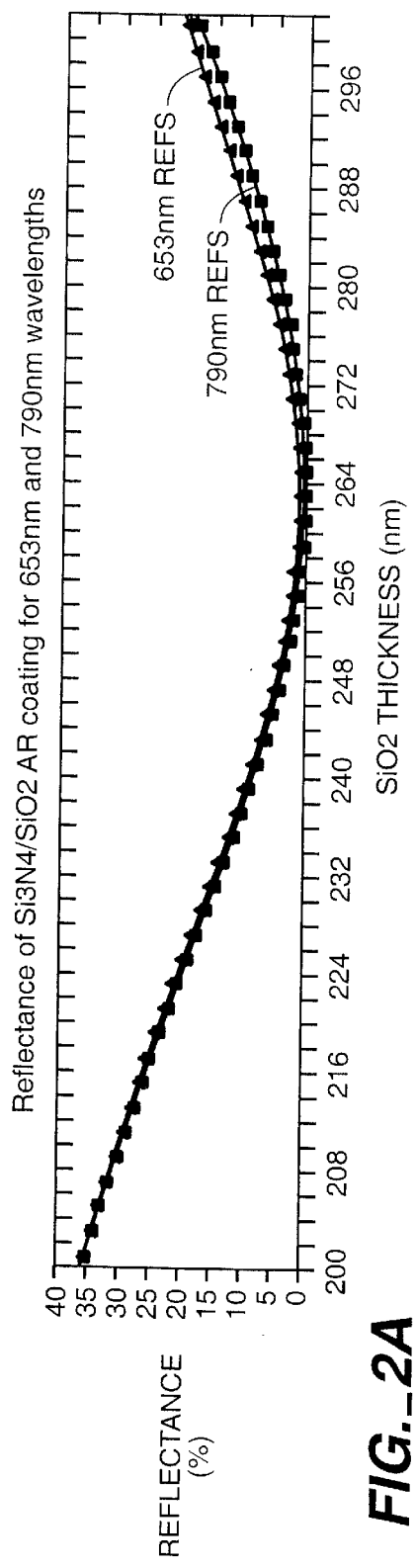
FIG._2A
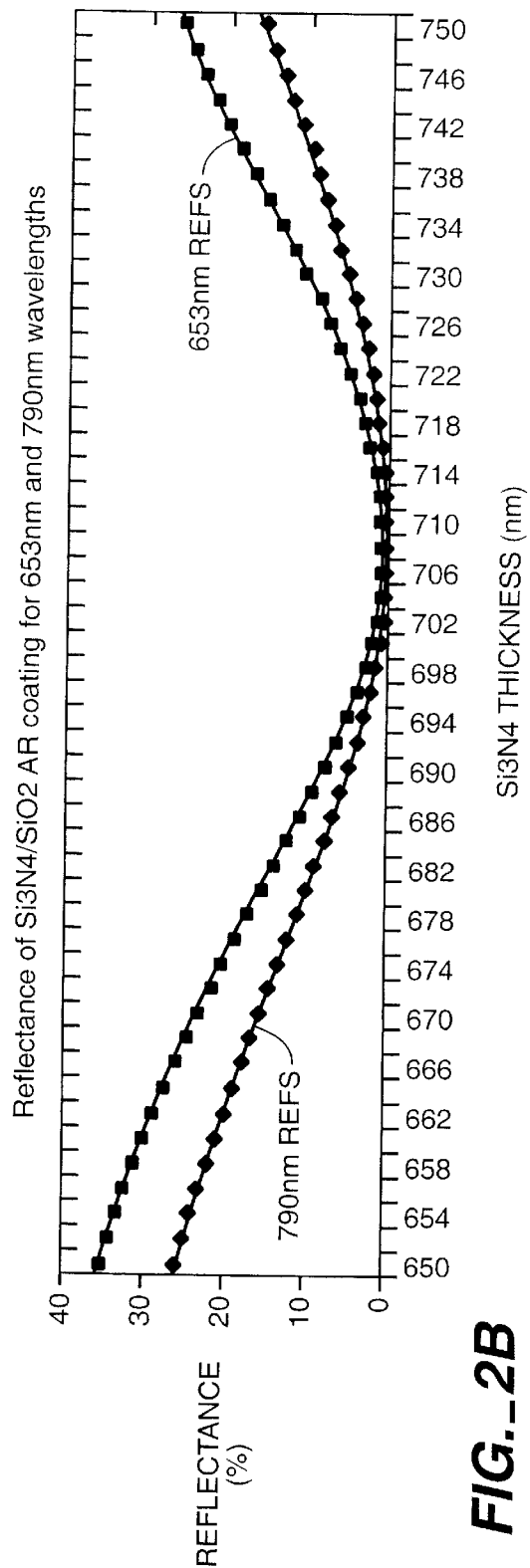
FIG._2B

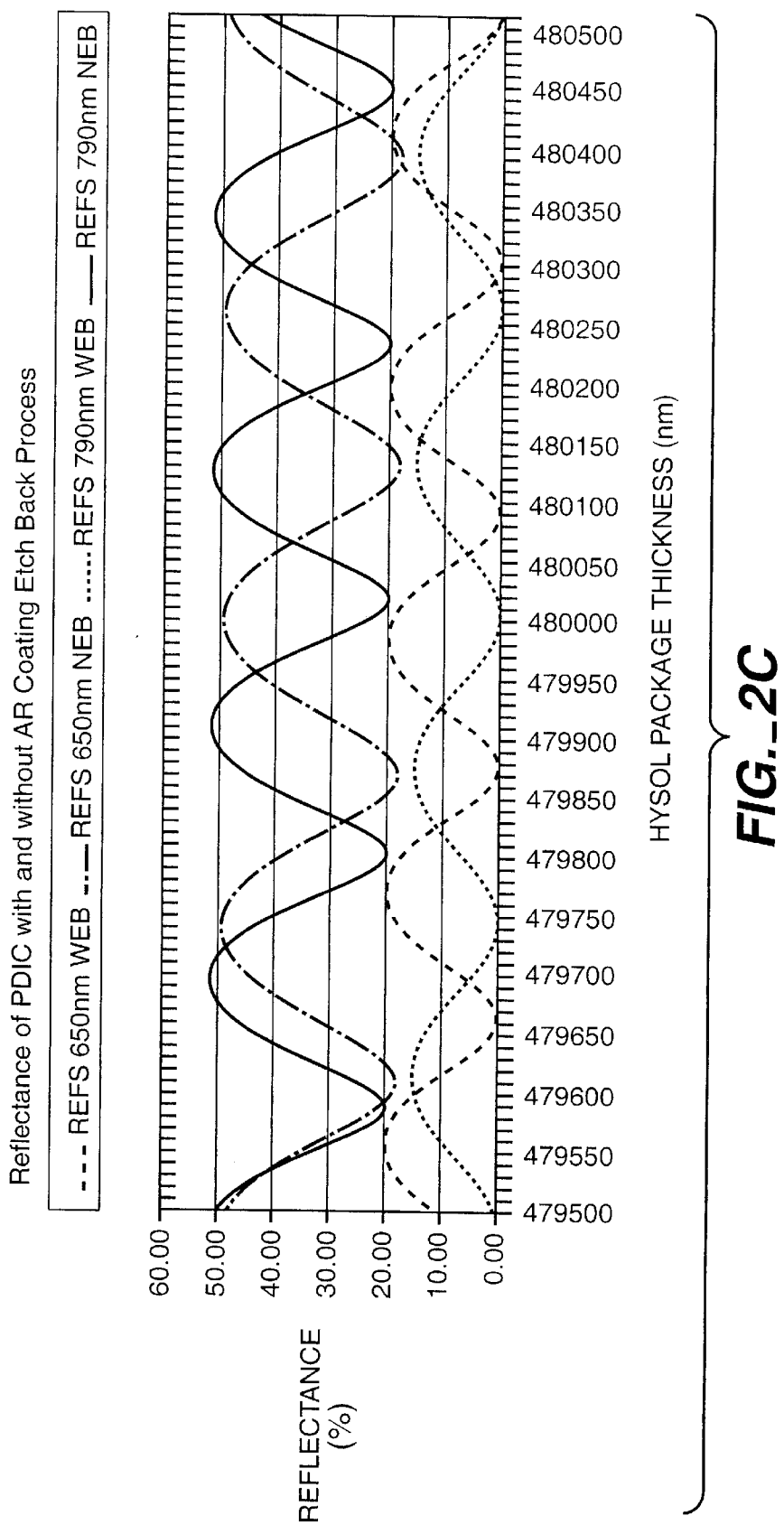
FIG._2C

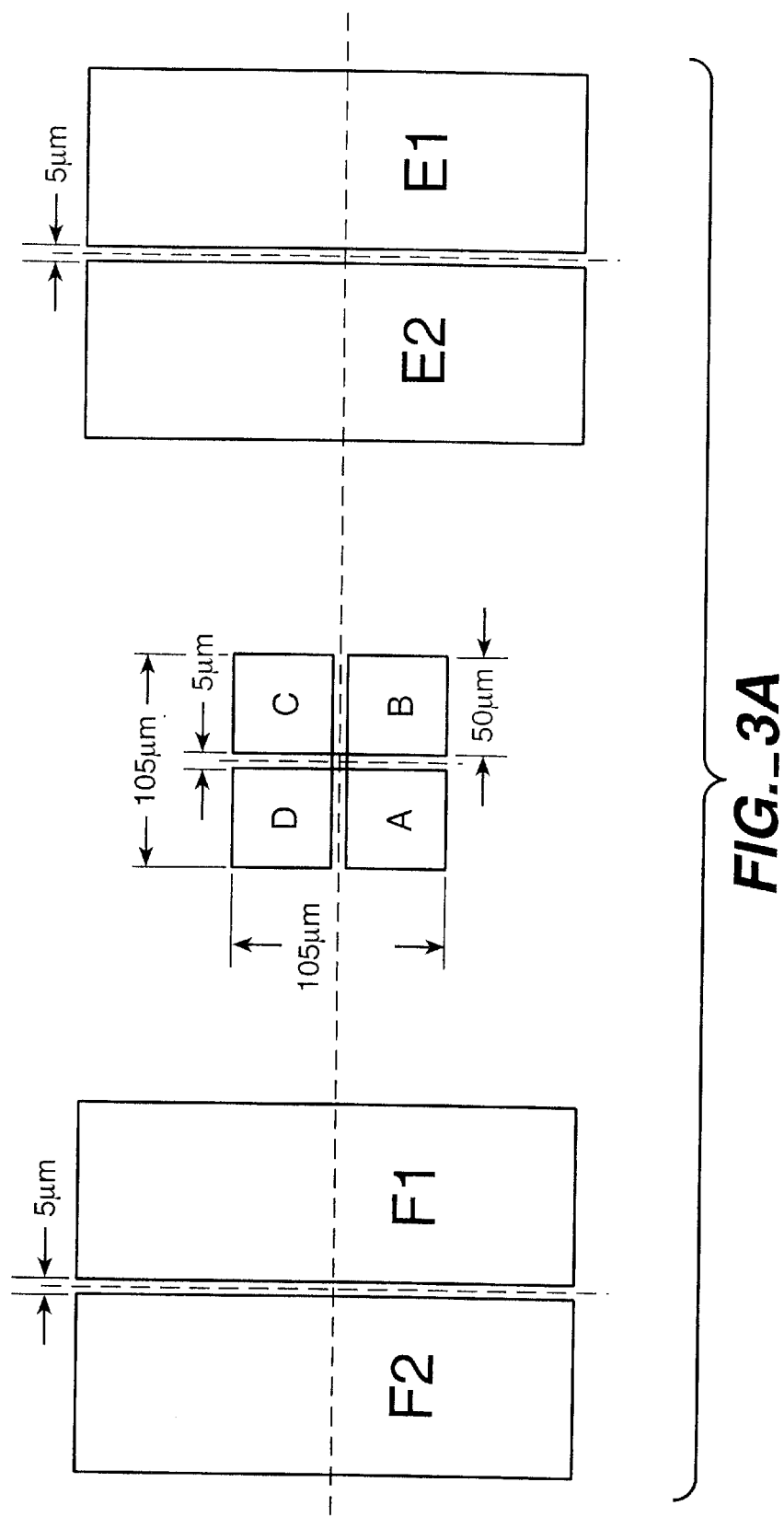
FIG._3A

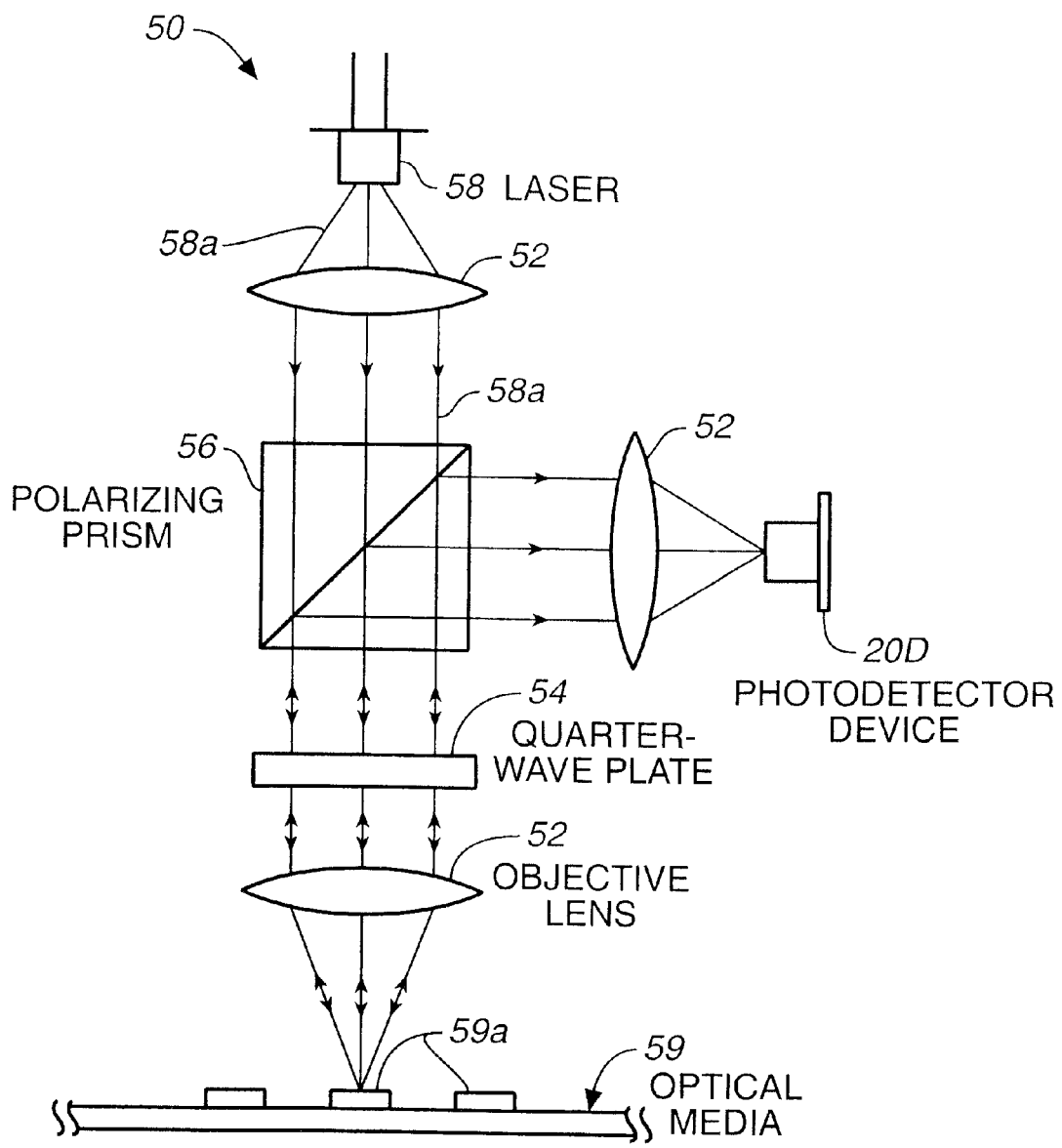
FIG._3B

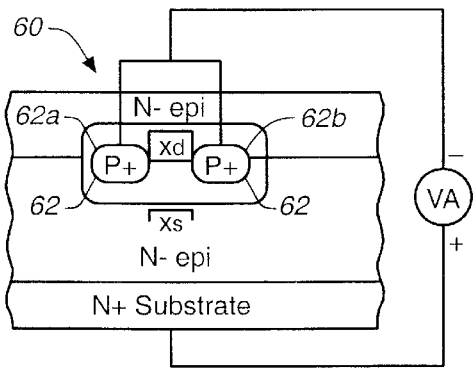
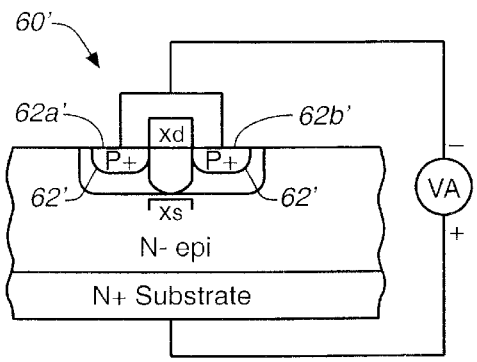
FIG._4A    FIG._4B
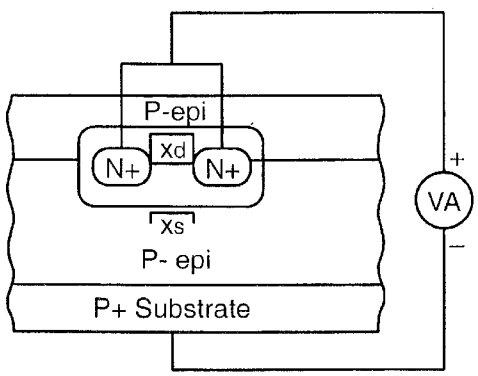
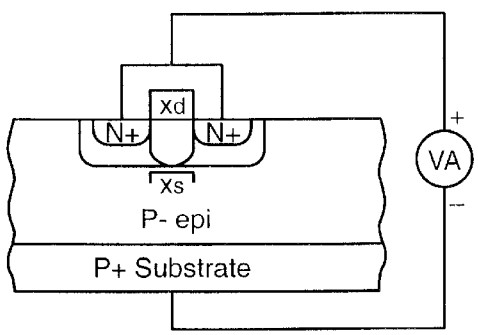
FIG._4C    FIG._4D
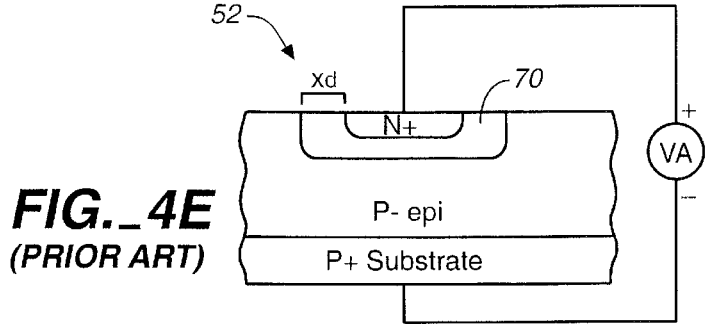
FIG._4E
*(PRIOR ART)*

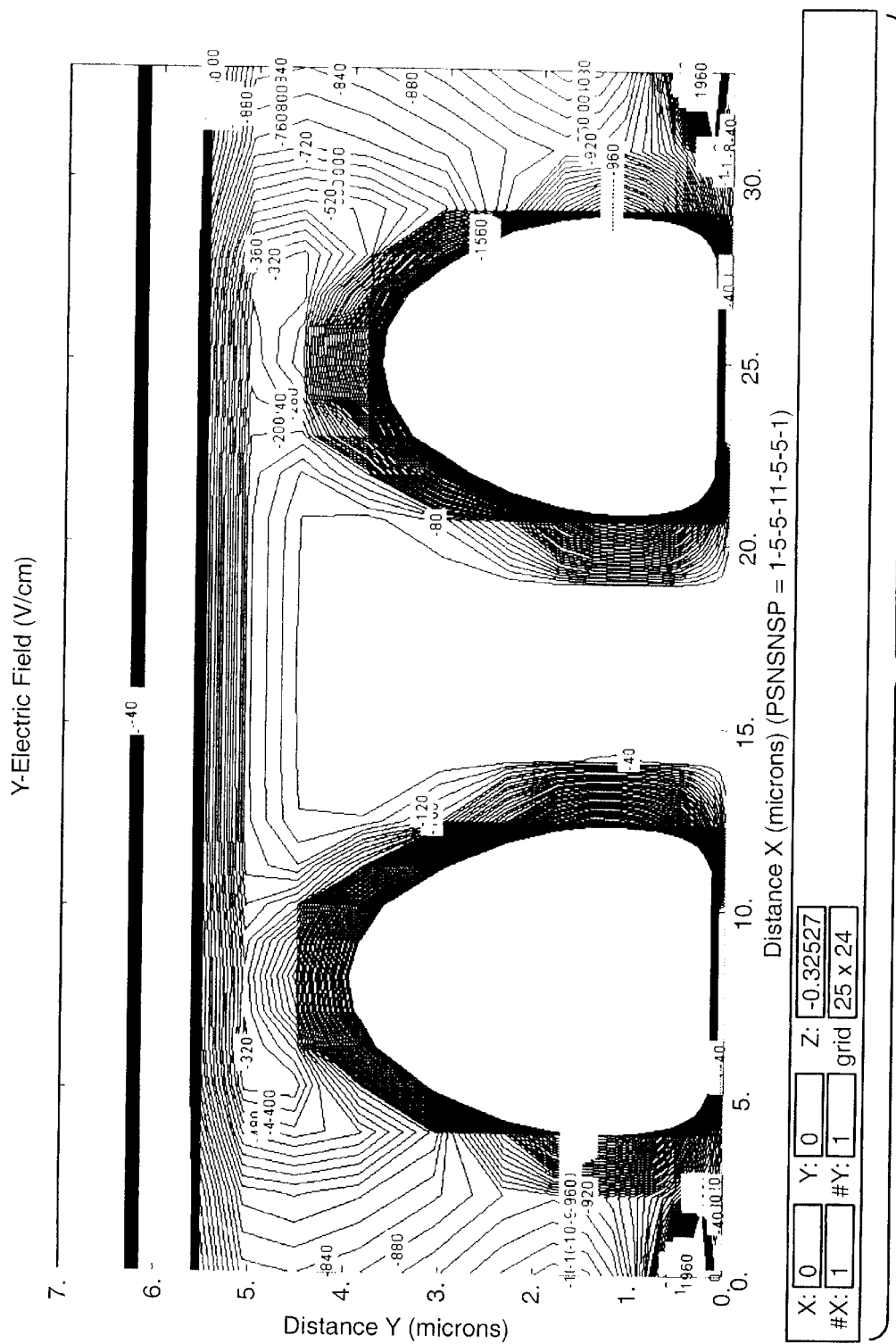
FIG._5A

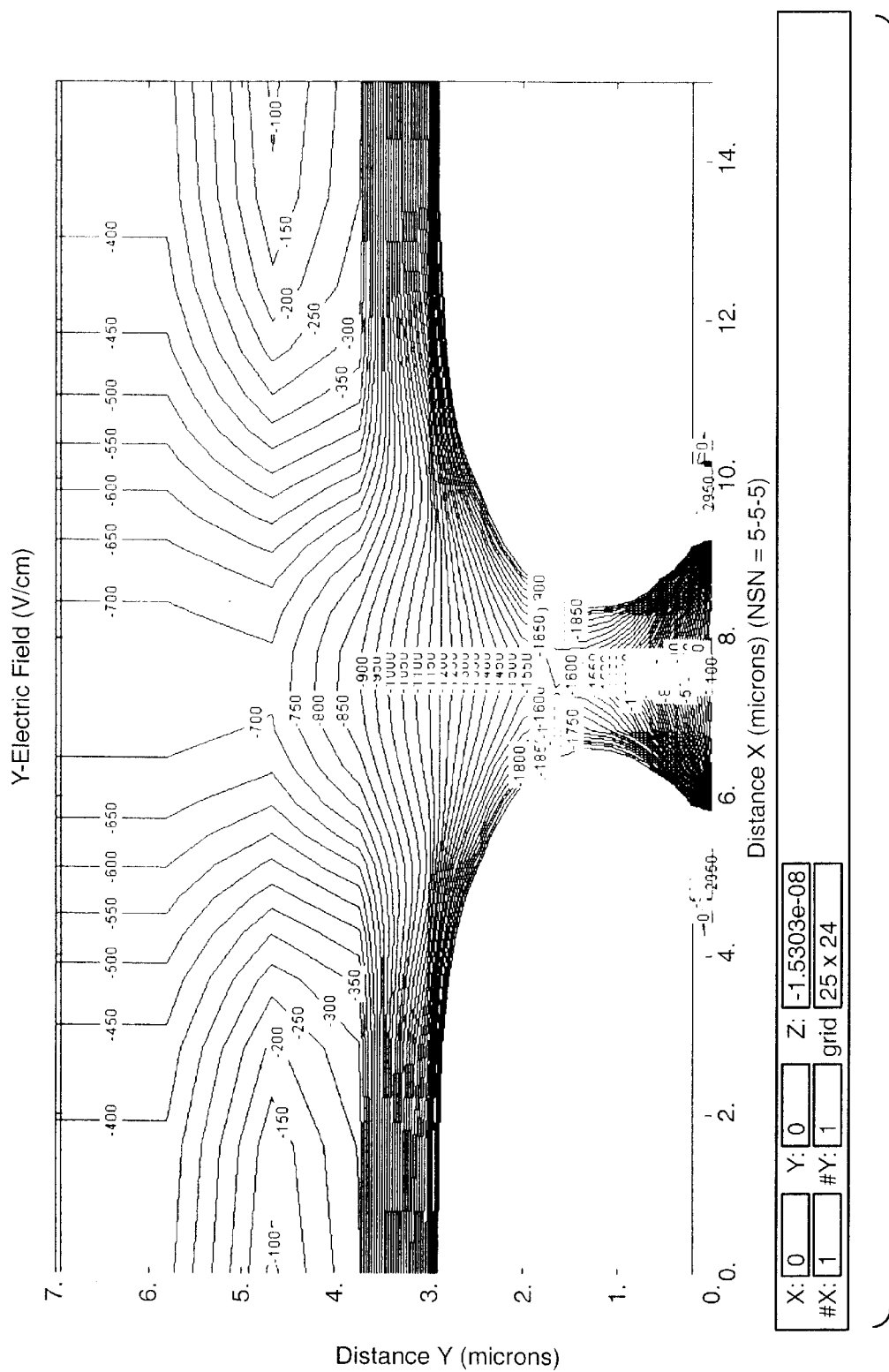
FIG._5B

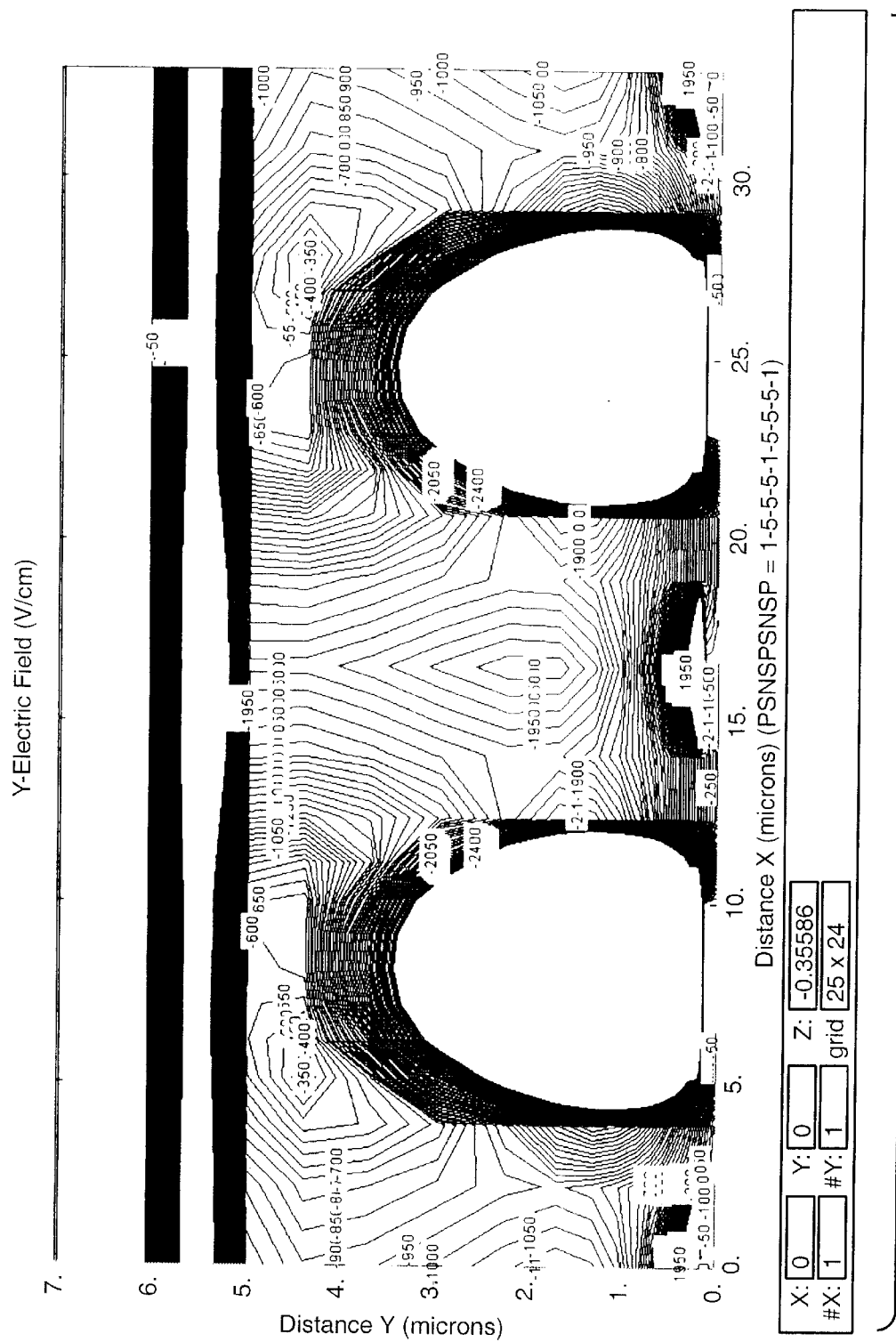
FIG._6A

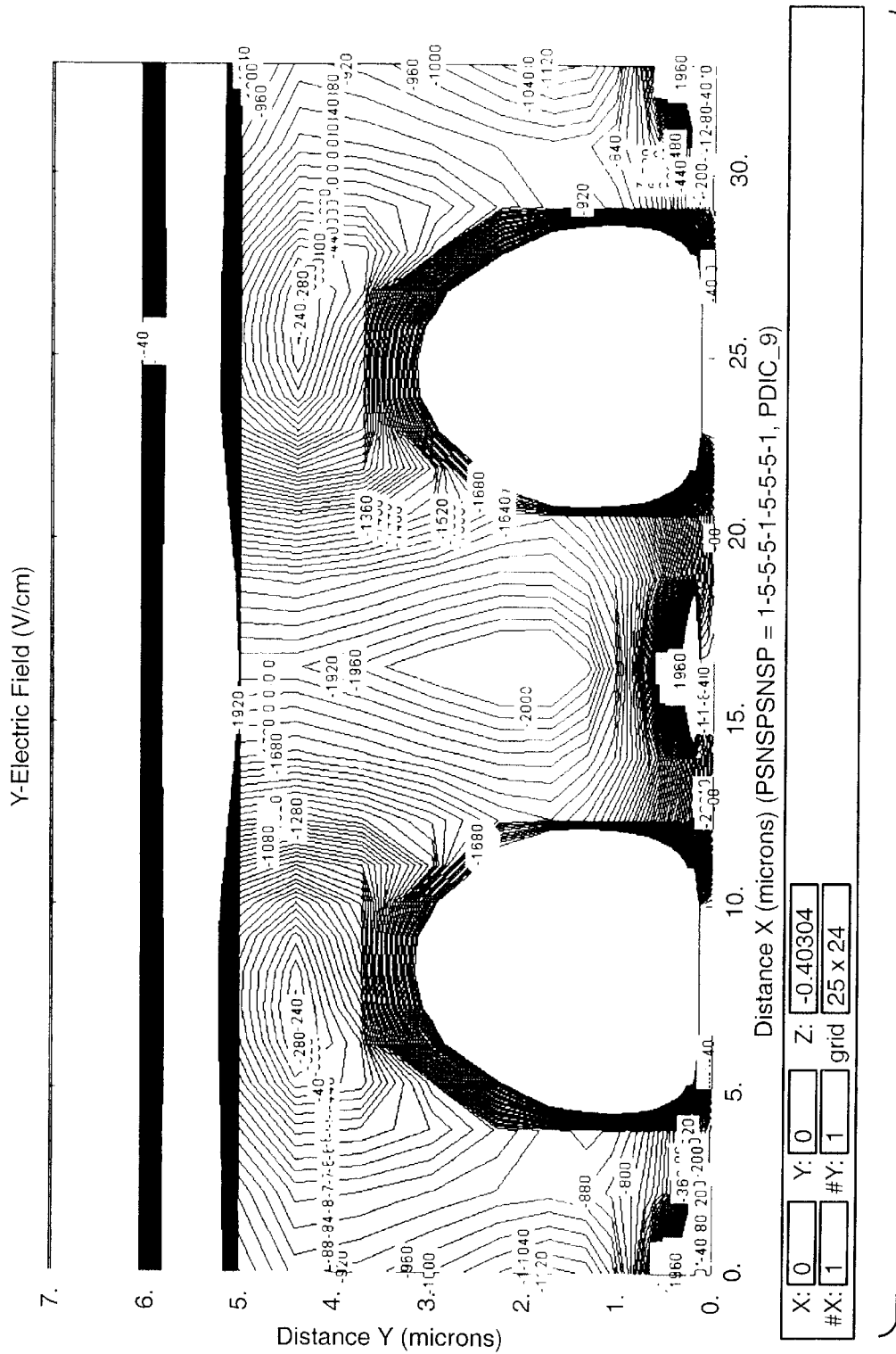
FIG._6B

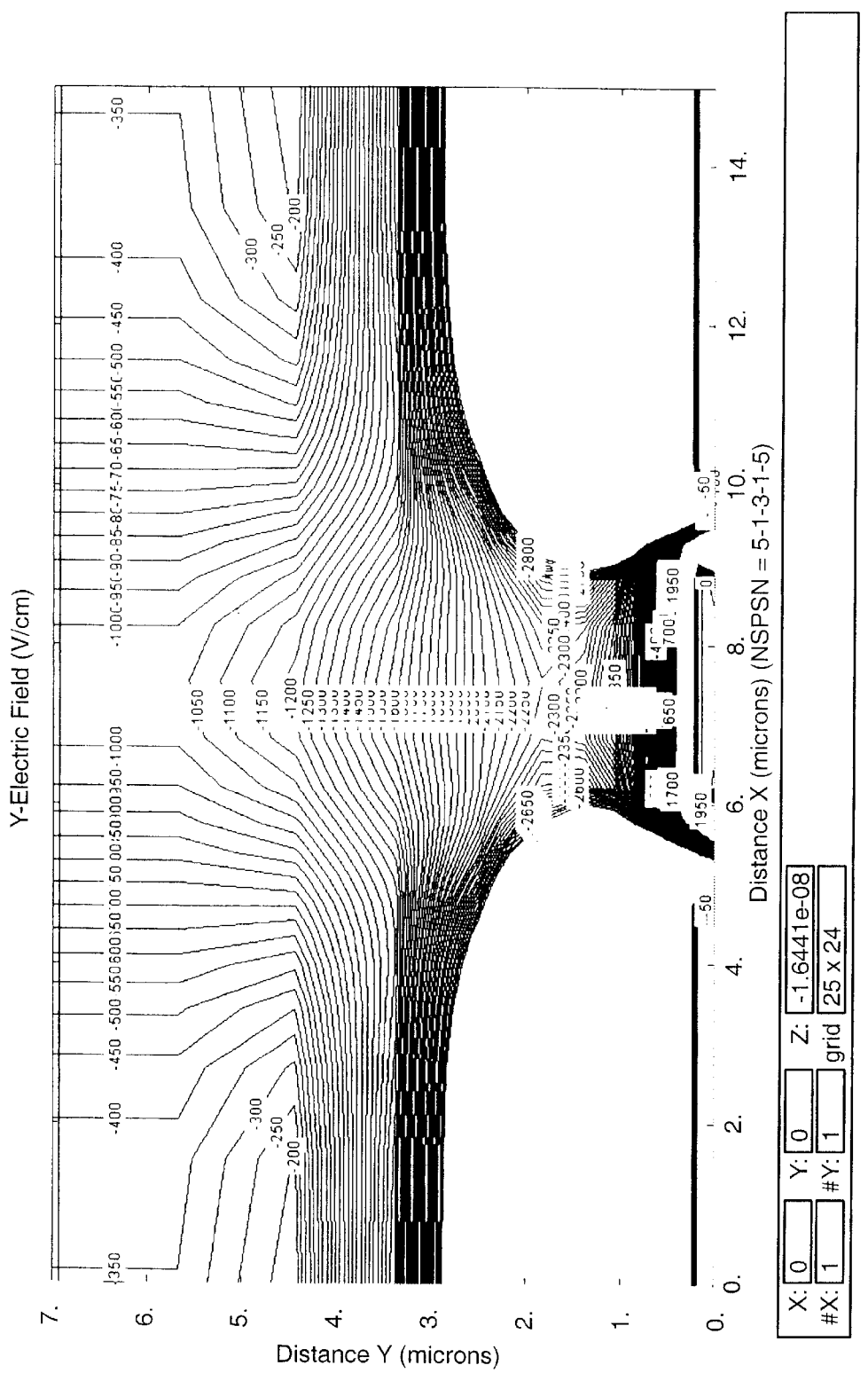
FIG._6C

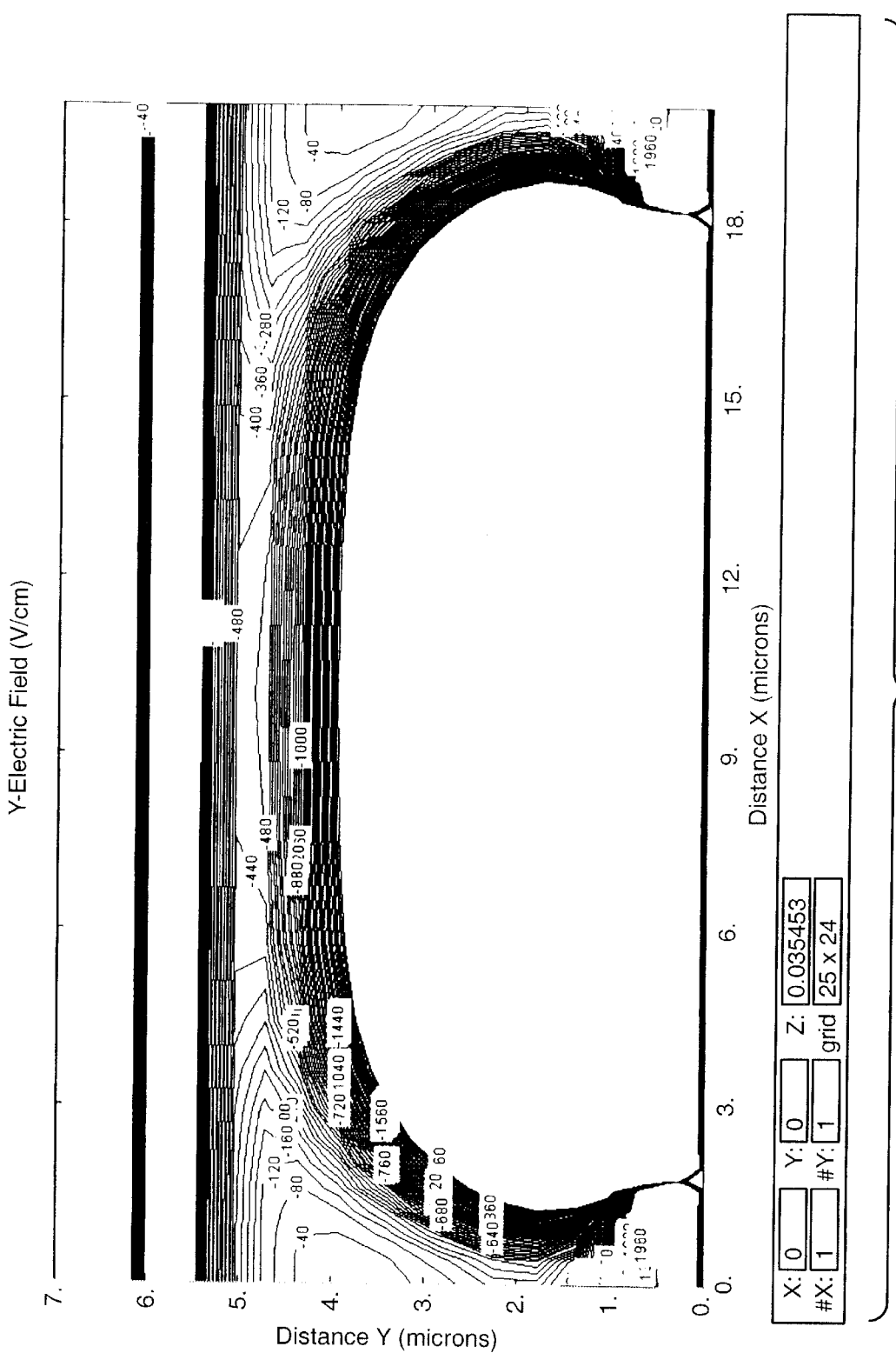
FIG._7A

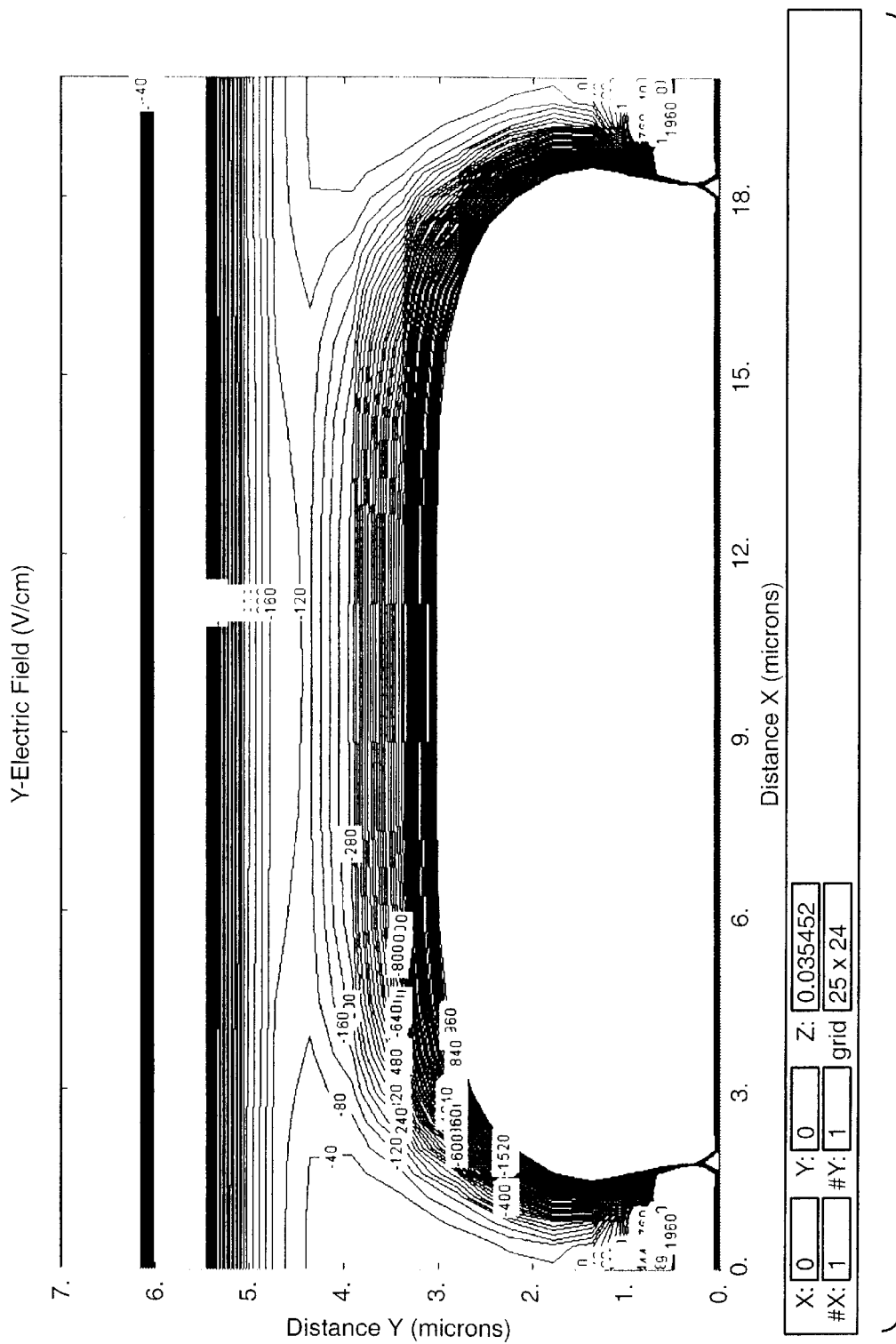
FIG._7B

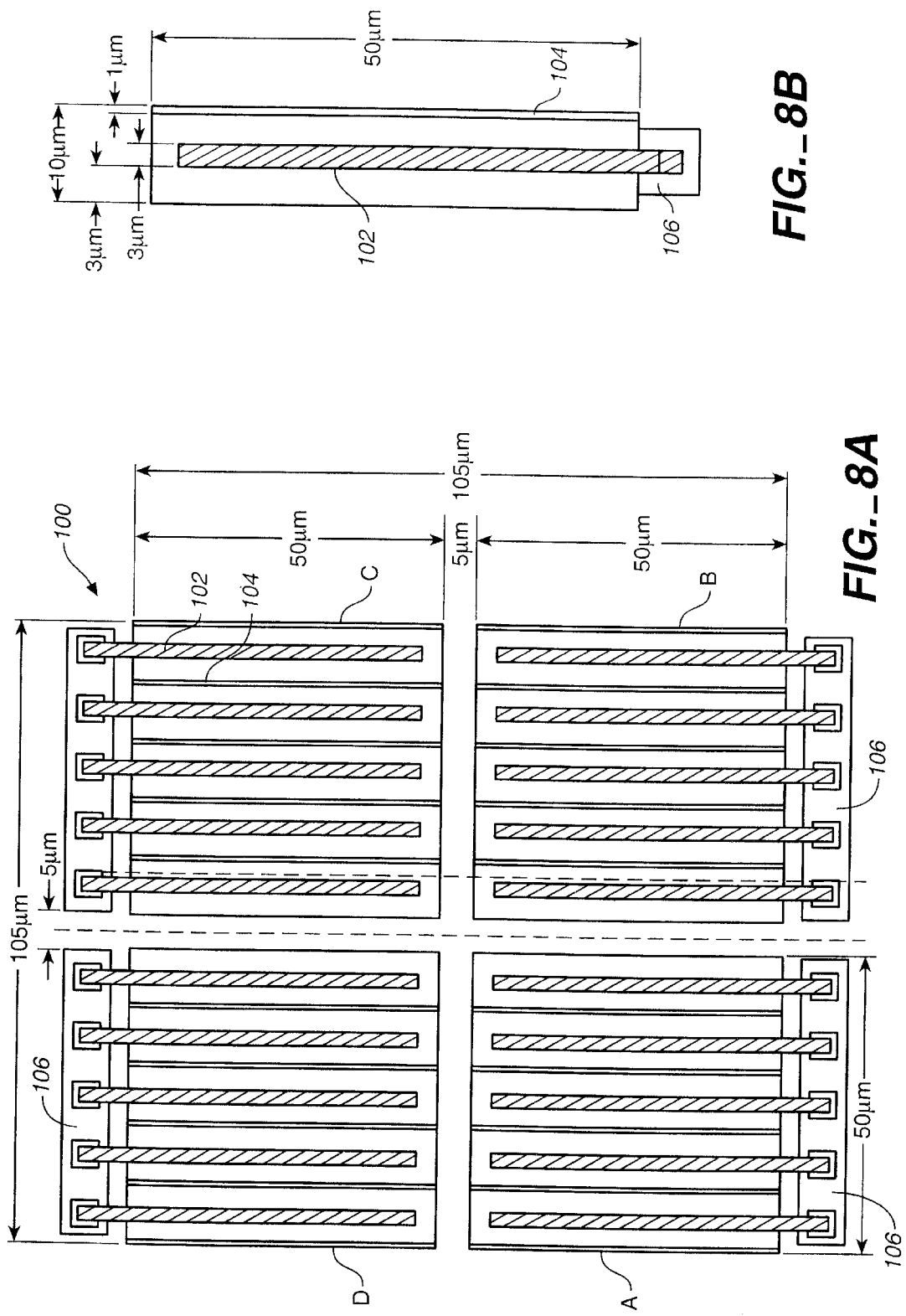

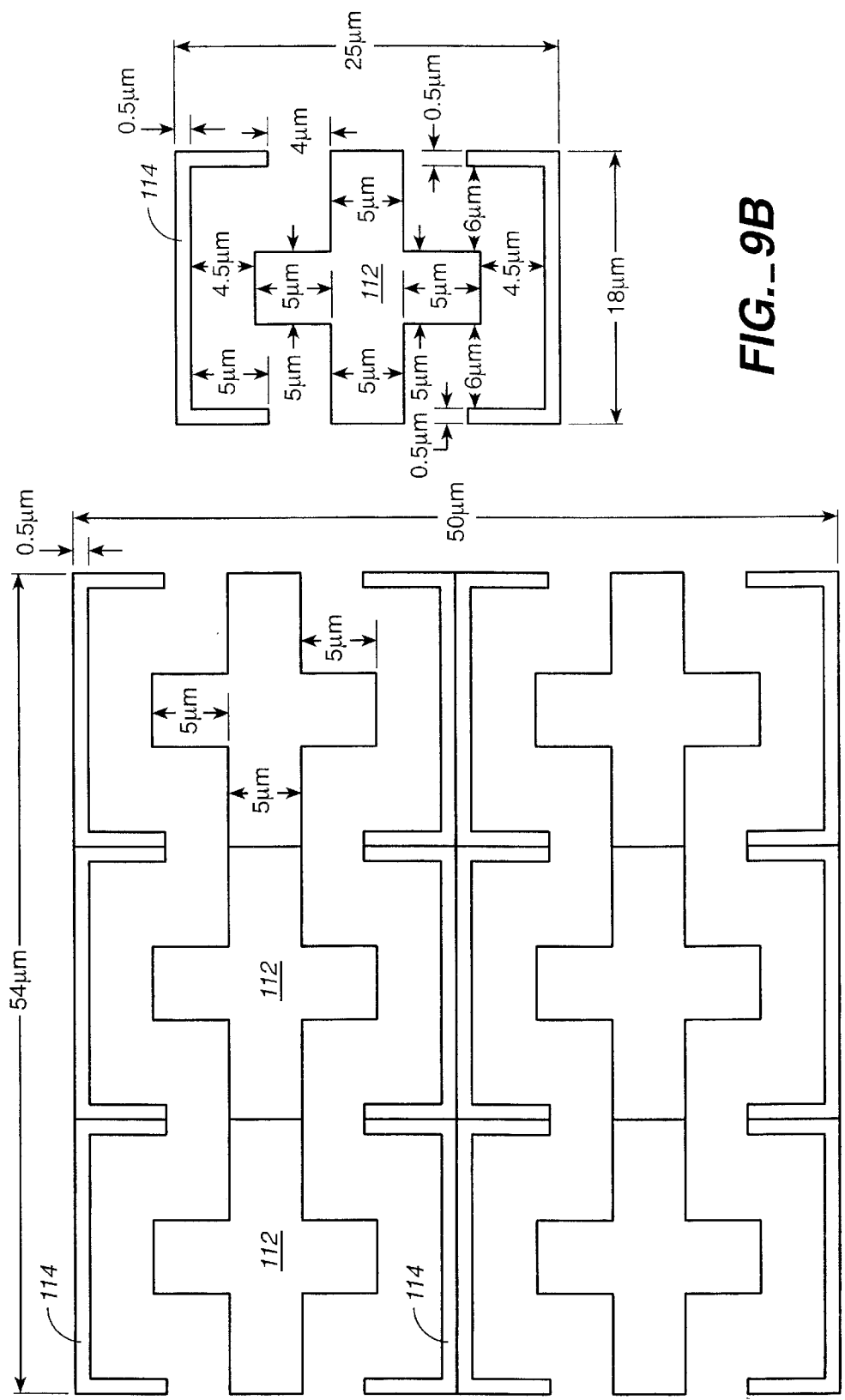
FIG._9B
FIG._9A

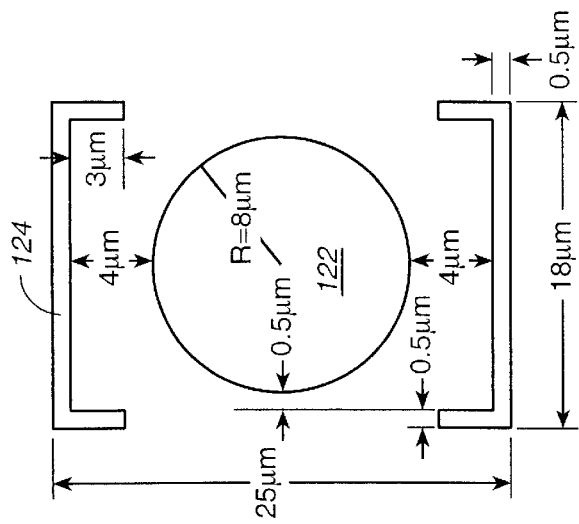
*FIG._10B*
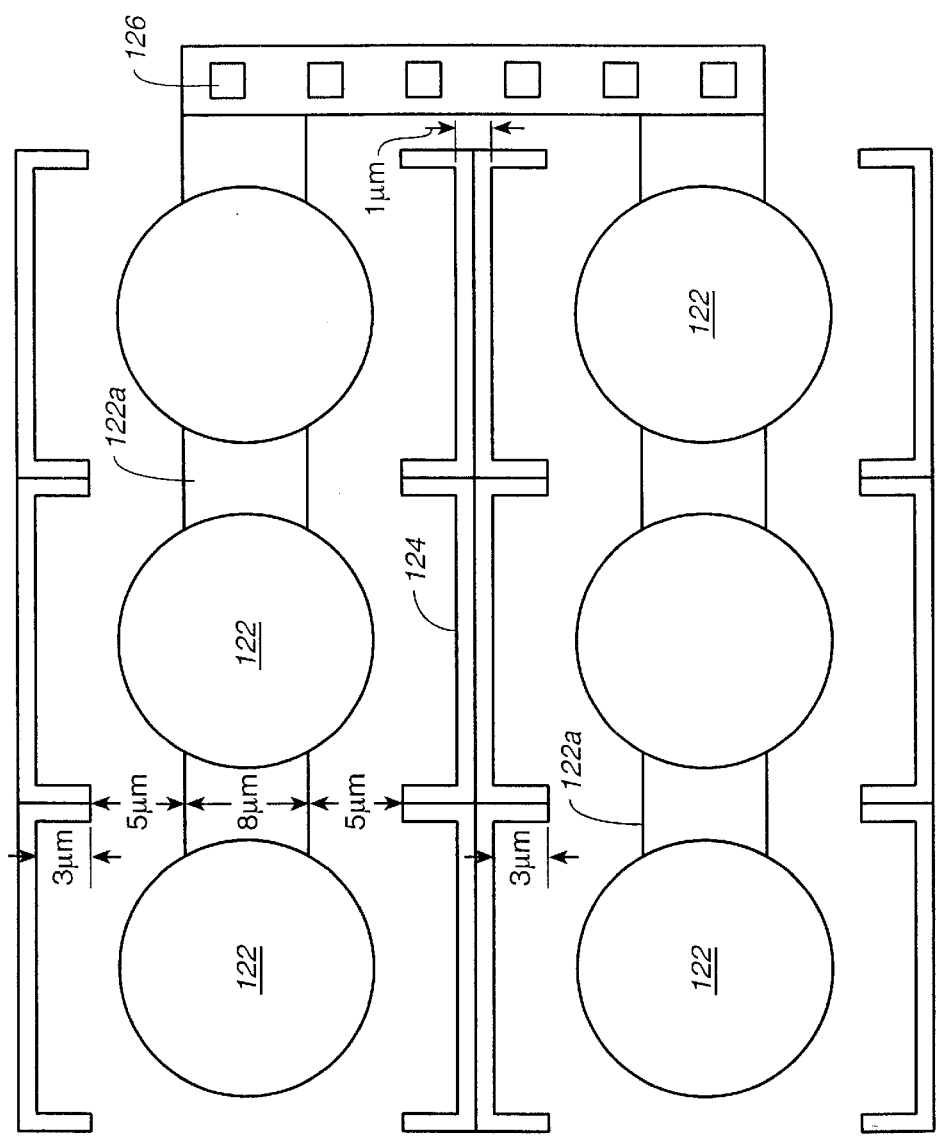
*FIG._10A*

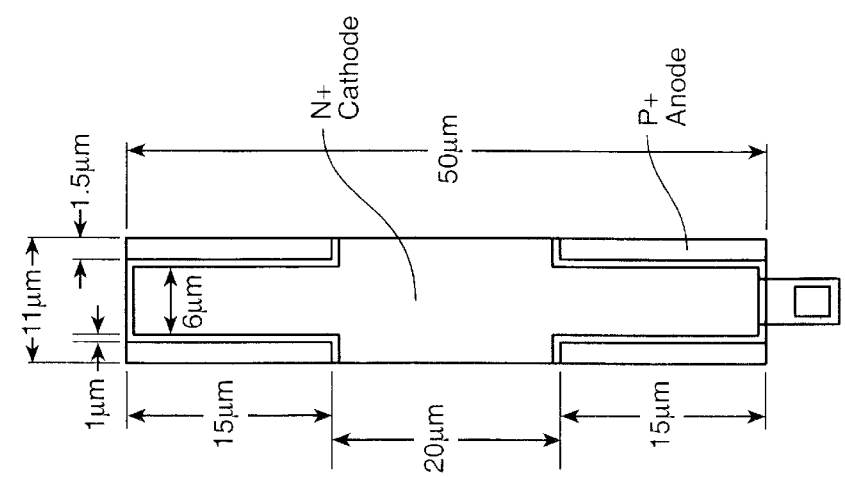
FIG._11B
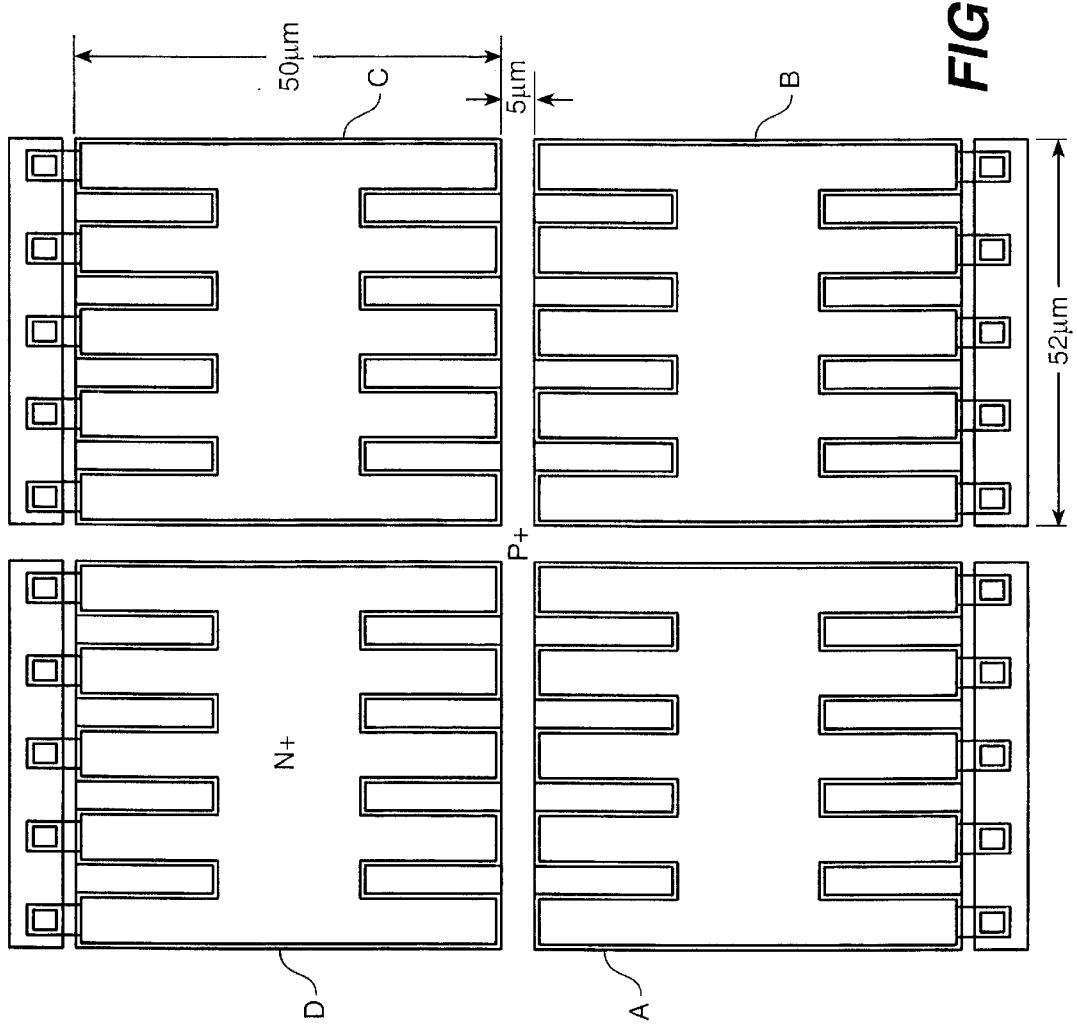
FIG._11A

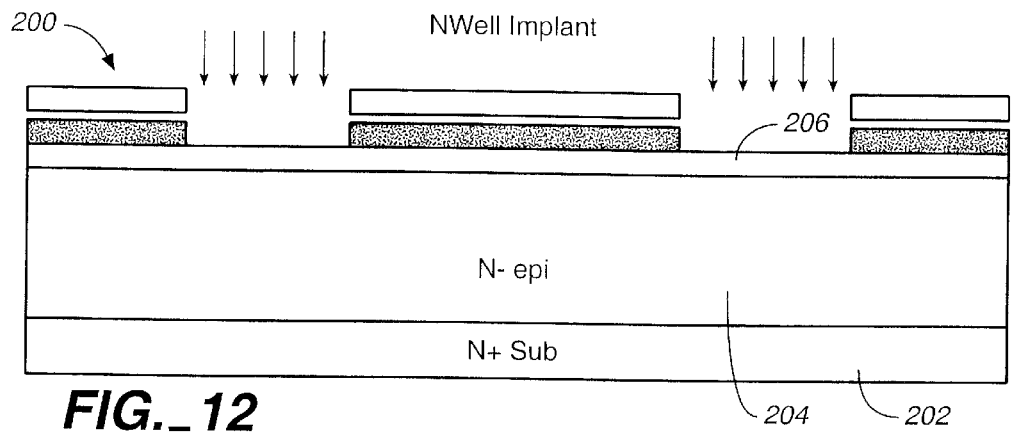
FIG._12
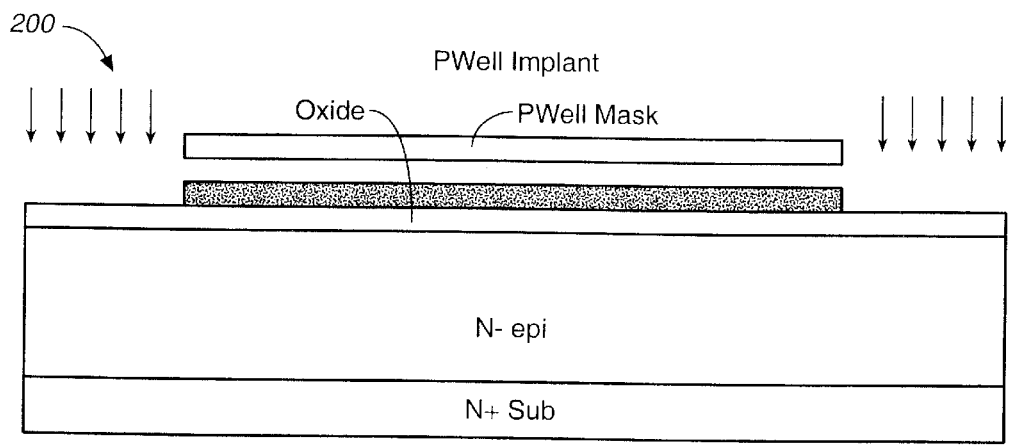
FIG._13
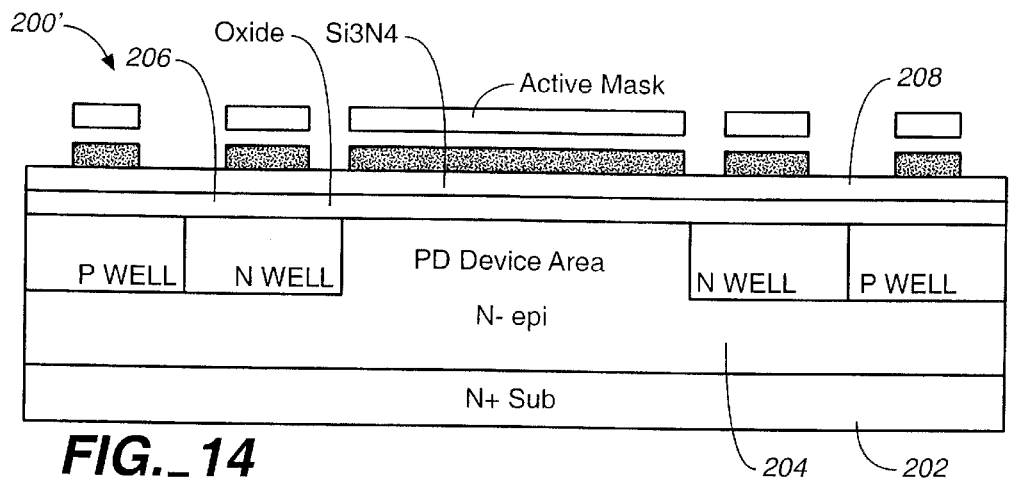
FIG._14

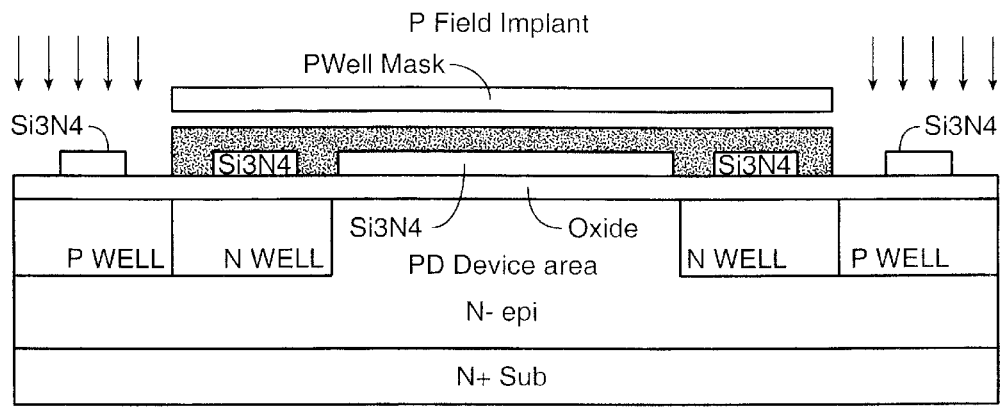
FIG._15
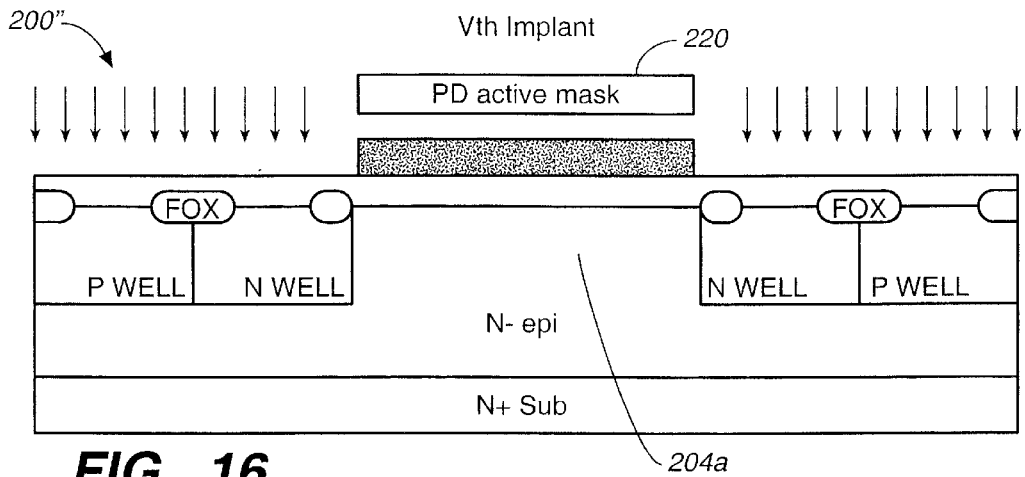
FIG._16
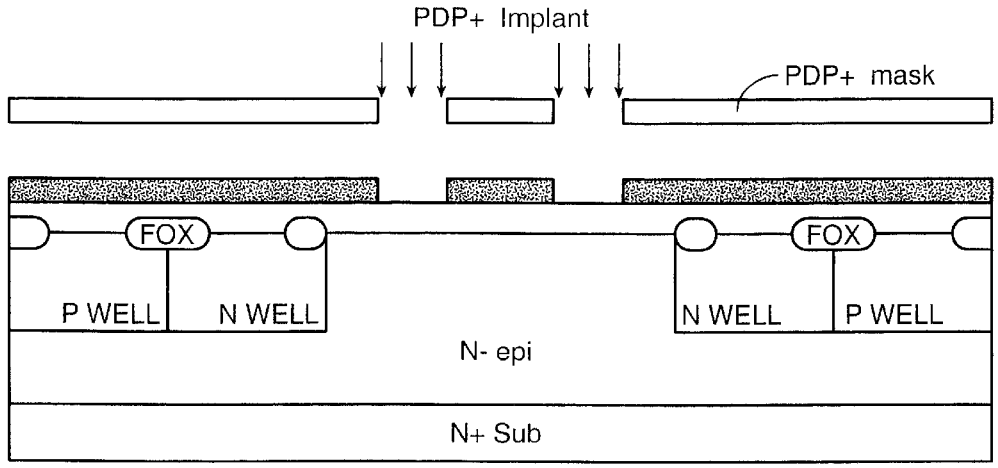
FIG._17

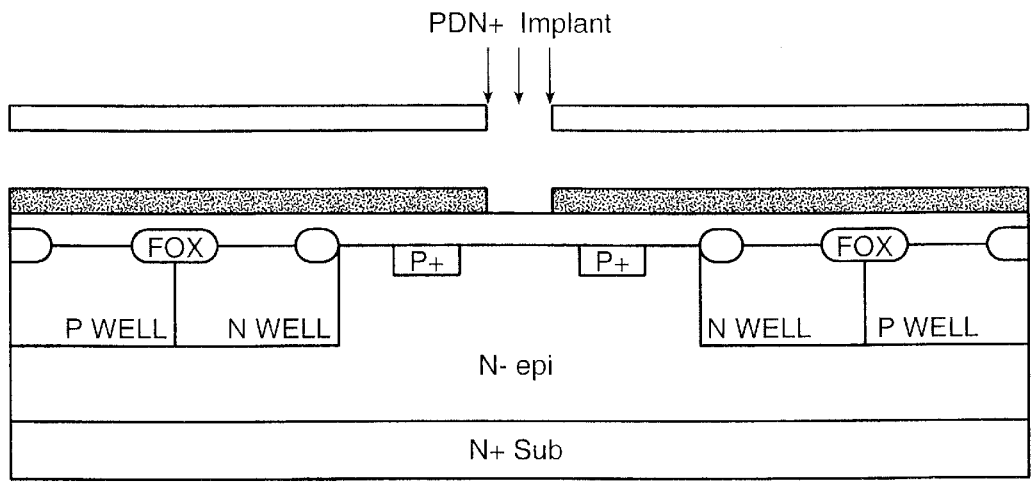
FIG._18
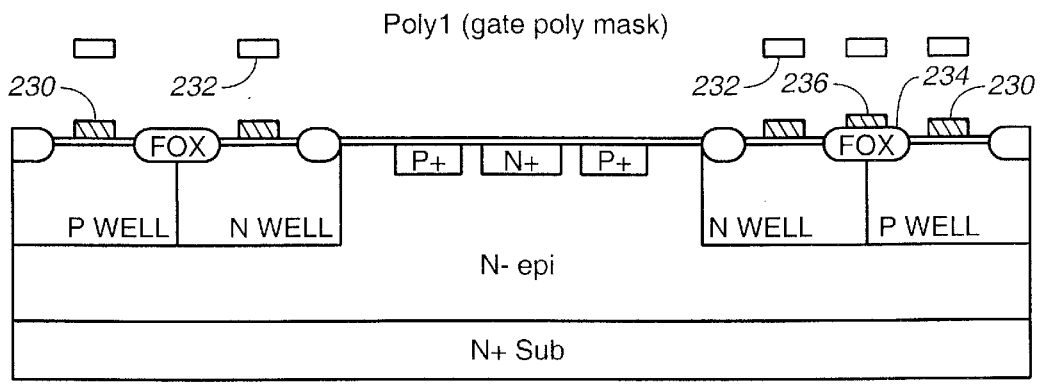
FIG._19
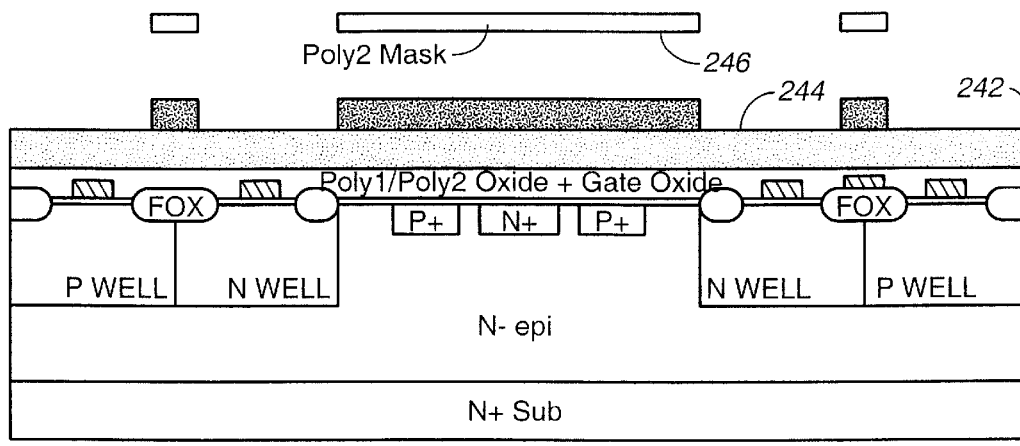
FIG._20

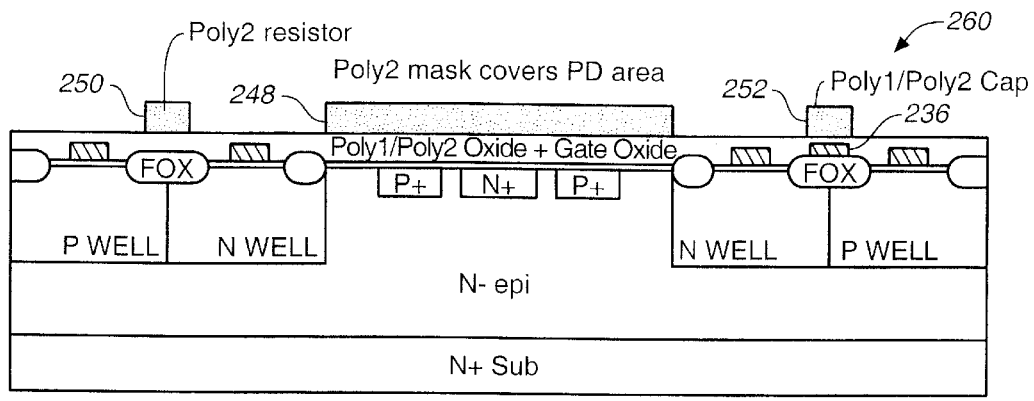
FIG._21
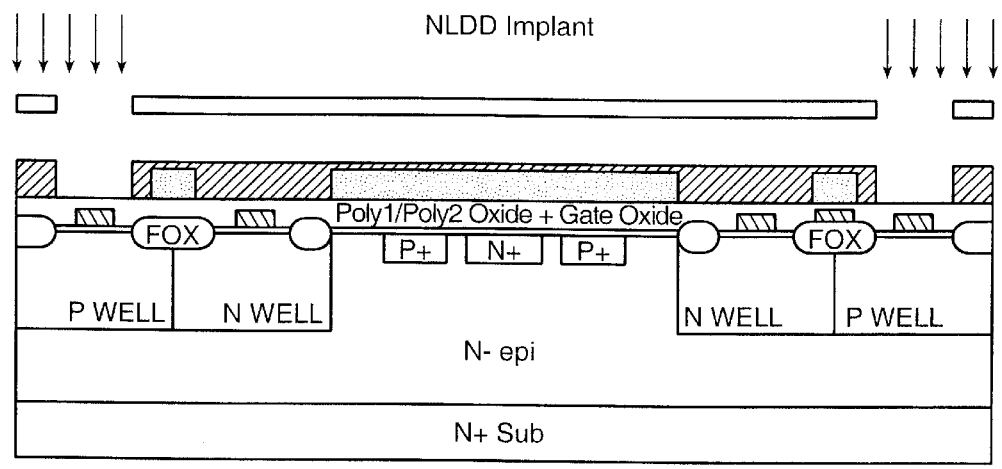
FIG._22
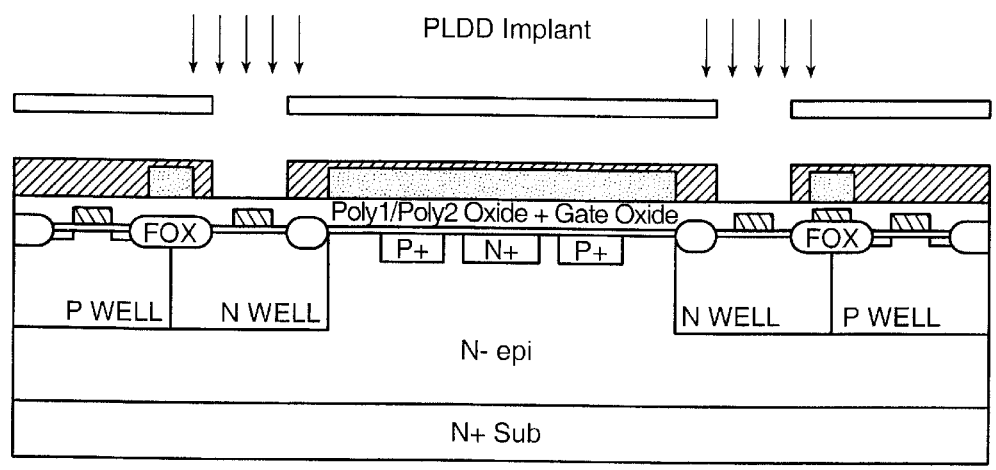
FIG._23

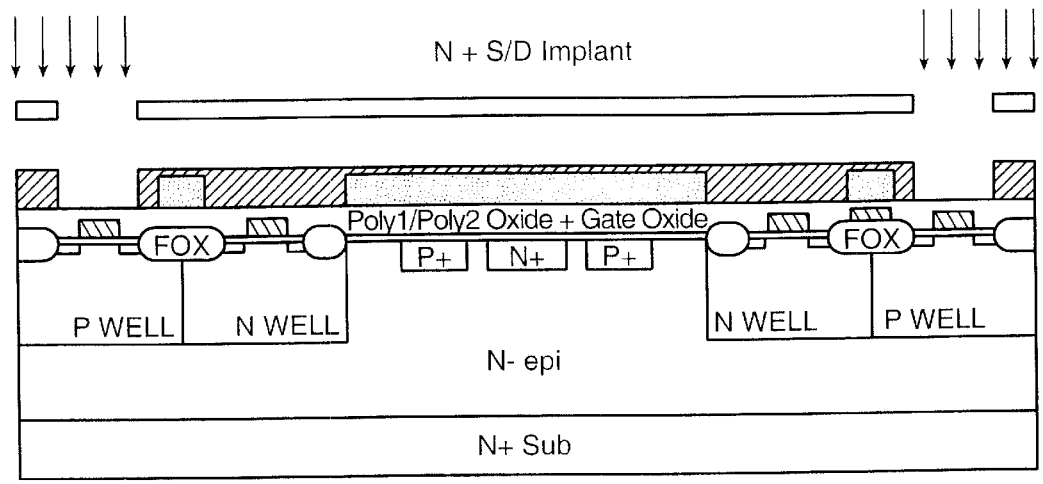
FIG._24
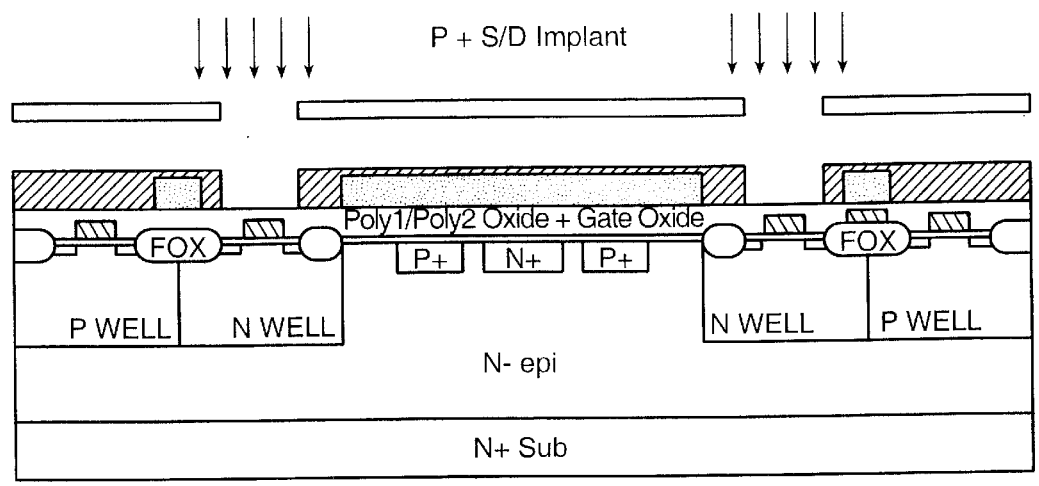
FIG._25A
FIG._25B
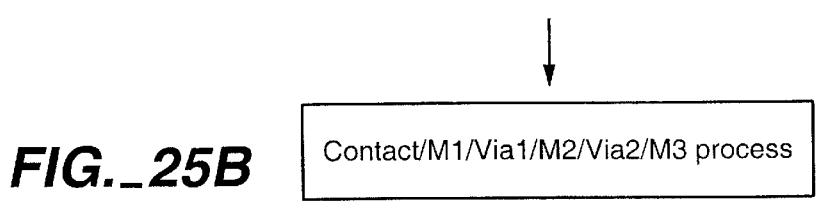
FIG._25C
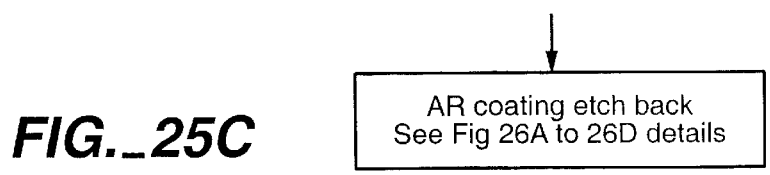

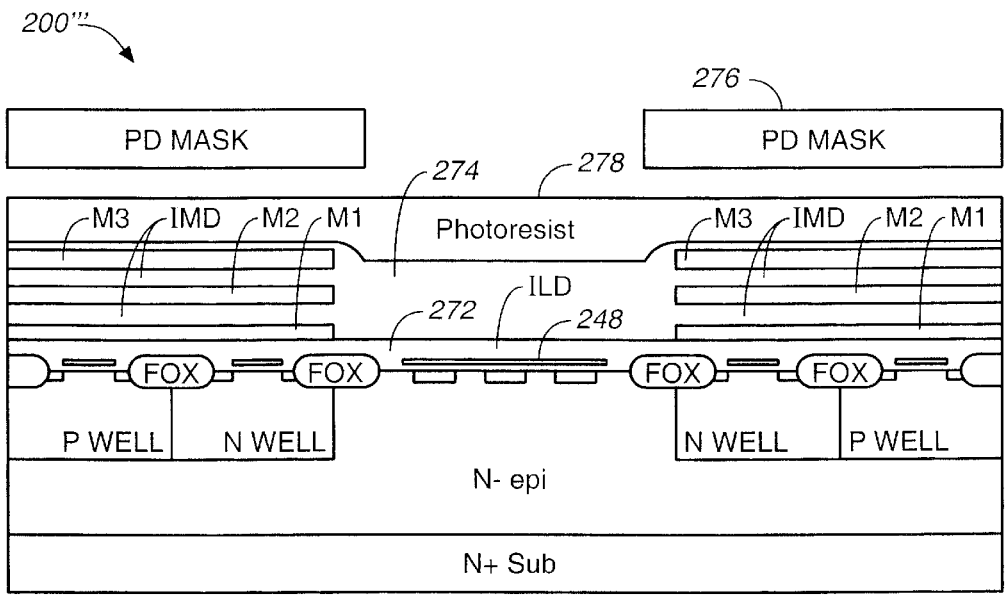
FIG._26A
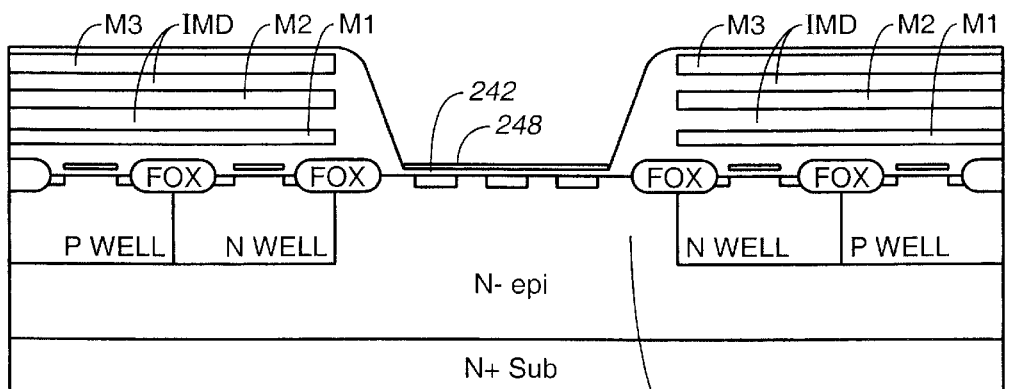
FIG._26B

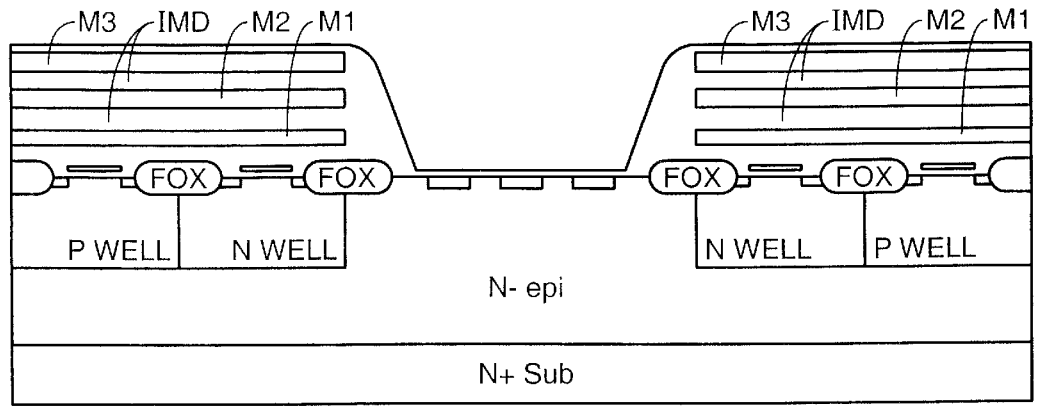
FIG._26C
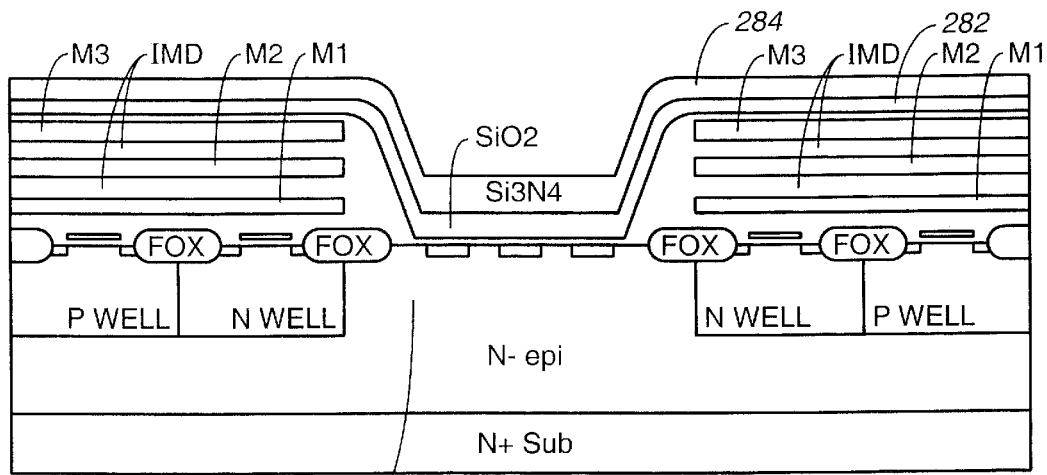
FIG._26D

PHOTODETECTOR AND DEVICE EMPLOYING THE PHOTODETECTOR FOR CONVERTING AN OPTICAL SIGNAL INTO AN ELECTRICAL SIGNAL

This application is a divisional application of U.S. patent application Ser. No. 09/234,015, filed Jan. 19, 1999 now U.S. Pat. No. 6,218,719, which is a continuation-in-part of U.S. patent application Ser. No. 09/156,872, filed Sep. 18, 1998, now abandoned.

BACKGROUND OF THE INVENTION

This invention relates in general to photodetectors and, in particular, to an improved photodetector and a device employing the photodetector for converting an optical signal into an electrical signal.

CD-ROM and DVD-ROM drives have become increasingly important and popular for use with personal computers and amusement game machines. CD-ROM and DVD-ROM drives typically employ optical pickup usually comprising two tracking photodetectors and four high speed split photodetectors, such as that explained and shown in the article "High Speed SI-OEIC (OPIC) For Optical Pickup," by Takimoto et al., *IEEE Transactions on Consumer Electronics*, Vol. 44, No. 1, February 1998, pages 137–142.

As noted by the Takimoto article, CD-ROM and DVD-ROM drives are progressing in terms of system compactness and performance. But when the size of these drives are reduced, cross-talk has become an issue due to the close spacing between the components of the drive. To reduce the influence of external noise from the motor and other electrical circuits, the photodiode used in optical pickup has been integrated with the preamplifier circuit that is used to amplify the output of the photodetector.

CD-ROM and DVD-ROM drives have increasingly been used for reading video data, such as data for motion pictures. For such applications and for improved performance in other applications, it is important for the CD-ROM and DVD-ROM drives to have wide bandwidths.

Optical pickup components currently employed in CD-ROM and DVD-ROM drives are typically bipolar devices. While bipolar devices may have acceptable performance for such applications, with the intense competition in the consumer electronics industry, it is desirable to provide alternative designs that are cheaper than the current optical pickup designs.

None of the above-described conventional optical pickup devices for CD-ROM and DVD-ROM drives are entirely satisfactory. It is, therefore, desirable to provide an improved optical pickup and photodiode design to avoid some of the difficulties described above.

SUMMARY OF THE INVENTION

Applicant proposes an optical photodetector device implemented as CMOS devices which are much cheaper than bipolar photodetector devices. Preferably, the CMOS processing circuit for amplifying the photodiode output and the photodiode may be implemented in the same semiconductor substrate.

In another aspect of the invention, the P or N type semiconductor material that forms one side of the PN junction has at least two portions that are spaced apart by not more than twice the one-sided junctioned depletion width in a configuration referred to herein as a distributed structure or configuration. By employing a PN junction of such type where the semiconductor material forming one side of the junction is so distributed, this has the effect of increasing both the density and amplitude of electric field in the depletion region of the photodiode, thereby reducing drift time of carriers in the depletion region. The responsivity can be further increased by preferably employing a highly doped semiconductor region between the two portions of the semiconductor material that forms one side of the junction.

When the photodiode with a distributed configuration of semiconductor material as one side of the PN junction is employed in a CD-ROM or a DVD-ROM drive, it is preferable for the two spaced apart portions of such material to be spaced apart by a spacing in the range of 5 to 15 microns.

To further enhance the responsivity of the photodiode, an anti-reflective filter is employed over the entire photosensitive region on the surface of a semiconductor substrate. The filter includes a first layer of silicon nitride and a second dielectric layer contiguous with the first layer.

In fabricating CMOS devices, a threshold Vth implantation (hereinafter referred to as "Vth implant" or "Vth implantation") is performed to adjust the threshold voltage(s) of the CMOS devices. Where the CMOS devices and the photodetector are fabricated on the same substrate, a mask is preferably provided to shield the portion of the substrate in which the photodetector region has been or is to be formed during the implantation, and the Vth implantation is performed only on the portion of the substrate that is not shielded by the mask, so that such implantation does not affect the photodetector.

BRIEF DESCRIPTION OF THE DRAWINGS

FIG. 1A is a cross-sectional view of an integrated circuit of a photodetector and CMOS processing circuit, photodetector mask and photoresist to illustrate the circuit and a process for forming an anti-reflective coating for the photodetector and its processing circuit.

FIGS. 1B–1D are cross-sectional views of an integrated circuit resulting from further processing steps on the circuit of FIG. 1A to illustrate the steps in a process for forming the anti-reflective coating.

FIG. 2A is a graphical illustration of the reflectance of a silicon nitride and silicon dioxide composite layer coating for 653 and 790 nanometers wavelengths, where the thickness of the silicon nitride layer is about 700 nanometers, to illustrate the reflectance as a function of the thickness of the silicon dioxide layer.

FIG. 2B is a graphical illustration of the reflectance of a composite silicon nitride and silicon dioxide layer anti-reflective coating for 653 and 790 nanometers wavelengths, where the thickness of the silicon dioxide is about 255 nanometers thick, to illustrate the reflectance as a function of the thickness of the silicon nitride layer.

FIG. 2C is a graphical illustration of the reflectance of a photodiode integrated circuit with and without the anti-reflective coating of this invention as a function of the total thickness of the silicon nitride, silicon dioxide and package layers placed on top of the anti-reflective coating.

FIG. 3A is a schematic view of six photodetector elements for CD-ROM and DVD-ROM optical pickup applications.

FIG. 3B is a schematic view of an optical pickup configuration reading data from an optical media such as a disk to illustrate the invention.

FIGS. 4A–4D are cross-sectional views of a portion of a photodetector element suitable for use in any one of the photodetectors of FIG. 3A to illustrate four different embodiments of the invention employing a PN junction structure between two types of semiconductor material, with one type of material having a distributed structure to illustrate the preferred embodiments of the invention.

FIG. 4E is a cross-sectional view of a portion of a conventional photodetector.

FIG. 5A is a graphical plot of the electric field vector in a direction normal to the surface of the photodetector integrated circuit to illustrate the effect of the distributed N+ cathodes in a PN junction structure of this invention on the electric field in the photodetector.

FIG. 5B is a graphical plot of the electric field profile similar in nature to that of FIG. 5A, but with a different junction geometry.

FIGS. 6A and 6B are graphical plots of the electric field profile similar in nature to FIG. 5A at two different reverse bias voltages. The semiconductor structure illustrated in FIGS. 6A, 6B differs from that of FIG. 5A in that, in addition to the distributed PN junction structure of FIG. 5A, a P+ region is sandwiched between the two N+ cathodes also present in the structure of FIG. 5A, so that FIGS. 6A, 6B illustrate effects of the electric field of the revised combined structure.

FIG. 6C is a graphical plot of the electric field profile similar in nature to FIG. 5B, but where the effects of an additional P+ region sandwiched between N+ cathodes are also shown.

FIG. 7A is a graphical plot of the electric field profile obtained with a conventional photodetector design.

FIG. 7B is a graphical plot of the electric field profile of a conventional photodetector design with a reverse bias voltage different from that of FIG. 7A.

FIG. 8A is a cross-sectional view of a quad detector suitable for use in the photodetector of FIG. 3A to illustrate an embodiment of the invention.

FIG. 8B is a cross-sectional view of a portion of the quad detector of FIG. 8A.

FIG. 9A is a cross-sectional view of one of the four detectors in a quad detector suitable for use for the photodetector of FIG. 3A to illustrate another embodiment of the invention.

FIG. 9B is a cross-sectional view of a portion of the detector of FIG. 9A.

FIG. 10A is a cross-sectional view of a photodetector suitable for use for one of the detectors in the quad detector of FIG. 3A to illustrate yet another embodiment of the invention.

FIG. 10B is a cross-sectional view of a portion of the detector of FIG. 10A.

FIG. 11A is a cross-sectional view of a quad detector suitable for use in the photodetector of FIG. 3A.

FIG. 11B is a cross-sectional view of a portion of the detector of FIG. 11A.

FIGS. 12–19 are cross-sectional views of semiconductor substrates to show the processing steps for fabricating CMOS devices and a photodetector in the same semiconductor substrate, where a Vth implantation is performed on the portion of the substrate for the CMOS devices but shielded from the region of the substrate for the photodetector to illustrate the invention.

FIGS. 20–24, 25A–25C and 26A–26D are cross-sectional views of semiconductor substrates after the device from FIG. 19 have been further processed to show the different processing steps for fabricating a second polysilicon layer to form resistors and capacitors and to use a second polysilicon layer as an etch stop during the fabrication of an antireflective ("AR") coating to illustrate the invention.

For simplicity in description, identical components in this application are identified by the same numerals.

DETAILED DESCRIPTION OF THE PREFERRED EMBODIMENT

As shown in FIG. 1A, a photodetector integrated circuit 20A includes a photodetector 22 and CMOS devices 24 which form a processing circuit for processing (e.g. amplifying) the output of photodetector 22 to illustrate the invention. In contrast to conventional devices which employ bipolar or a combination of bipolar and CMOS devices to process the output of the photodetector, in the preferred embodiment of FIG. 1A, only CMOS devices are used for processing the photodetector output. CMOS devices consume less power and are cheaper to make than bipolar devices. The entire integrated circuit 20A (and circuits 20B, 20C, 20D of FIGS. 1B–1D) may be made using a CMOS process so that the integrated circuit 20A is inexpensive to make.

FIGS. 1A–1D are cross-sectional views of an integrated circuit at different stages of processing for forming a composite anti-reflective coating of the desired composition and thicknesses to illustrate one aspect of the invention. As shown in FIG. 1A, since the CMOS process typically form a layer of polysilicon to be the gate of CMOS devices, such a layer is also formed over the photodetector 22.

In forming the CMOS devices, the polysilicon layer is separated from the top surface of the N-epitaxial layer by a thin layer of silicon dioxide having a well controlled thickness. Therefore, the same silicon dioxide of controlled thickness also separates the polysilicon layer 26 from the photodetector 22. On top of the polysilicon layer is an interlevel dielectric layer 28 and an intermetal dielectric layer 30 formed when the CMOS devices 24 are formed. Therefore, as a first step in fabricating the anti-reflective coating, a layer of photoresist 32 is formed on top of the intermetal dielectric layer 30 by means of PD mask 34. The intermetal dielectric and interlevel dielectric layers 30, 28 are etched down to the polysilicon layer 26, using the polysilicon layer as a mask or etch stop. Using the polysilicon layer as an etch stop preserves the integrity of the surface interface between the well controlled silicon dioxide layer underneath the polysilicon layer and the photodetector 22. The resulting structure 20B is shown in FIG. 1B. The polysilicon layer 26 is then removed, leaving the very thin and well controlled silicon dioxide layer above the photodetector 22 and the N– epitaxial layer 21. Such structure 20C is shown in FIG. 1C. A layer of silicon dioxide 42 is then deposited on structure 20C and then a silicon nitride layer 44 is deposited on top of the silicon dioxide layer to form the structure 20D in FIG. 1D. The silicon dioxide layer, which was originally between the photodetector 22 and the polysilicon layer 26 and which was left after the polysilicon layer has been removed, bonds well to the silicon dioxide layer deposited thereon.

The silicon dioxide layer 42 reduces leakage current at the photodetector 22. By forming a uniform layer of silicon dioxide over the entire active region of the photodiode serving as the photodetector, the thickness of the silicon dioxide can be well controlled. This is important to minimize the amount of reflection of the light. Thus, when a light signal is incident on the silicon nitride layer immediately above the photodetector 22, the light encounters a first interface between the medium (e.g. package layer 46) above the silicon nitride and the silicon nitride layer, the interface between the silicon nitride layer and the silicon dioxide layer, and lastly between the silicon dioxide layer and the photodetector 22. The thicknesses of the silicon nitride layer and of the silicon dioxide layer are selected to maximize destructive interference of the light reflected from such interfaces, thereby minimizing the amount of light reflected from the structure 20D and maximizing the amount of light that is transmitted through such interfaces to the photodetector 22. In order to minimize the amount of reflection and to maximize the amount of light transmitted through the different interfaces, it is important for the thickness of the silicon dioxide layer and that of the silicon nitride layer to be well controlled. As noted above, the formation of a uniform silicon dioxide layer enables the thickness of the dioxide layer to be well controlled. Furthermore, the silicon dioxide and the silicon nitride layers are compatible with the fabrication of CMOS devices 24 and may, therefore, be advantageously used for the purpose described.

Structure 20D is normally encapsulated by a packaging material, such as a transparent package layer 46 shown in FIG. 1D. Preferably, the package layer 46 has an index of refraction in the range of about 1.52 to 1.57 to minimize the amount of reflection and to maximize the amount of light transmitted to the photodetector 22.

The structure 20D may be used for converting a light signal into an electrical signal in a CD-ROM or DVD-ROM which employ light at two different wavelengths: 653 and 790 nanometers. For this reason, it is desirable for the anti-reflective composite coating, comprising layers 42 and 44, to be optimized for optical signal to electrical signal conversion at the operating wavelengths of CD-ROM and DVD-ROM, that is at the wavelengths of 653 and 790 nanometers. FIG. 2A is a graphical plot of the reflectance of the composite anti-reflective coating 42 and 44, where the silicon nitride layer has a thickness of about 700 nanometers and the reflectance of the composite coating is shown as a function of the silicon dioxide thickness for both wavelengths. As can be seen from FIG. 2A, the range of thicknesses of the silicon dioxide layer within which the reflectance of the composite coating 42, 44 is minimized for both wavelengths is within the range of about 262±22 nanometers (that is, range of about 240 to 285 nanometers). More preferably, such range is 262±15 nanometers. Thus, FIG. 2A is obtained by performing simulation of a structure similar to structure 20D having composite layers 42, 44 by keeping the thickness of the silicon nitride unchanged at about 700 nanometers but varying the thickness of the silicon dioxide layer.

The same can be done by keeping substantially constant the thickness of silicon dioxide and varying the thickness of silicon nitride as shown in FIG. 2B, where the thickness of silicon dioxide is fixed at about 255 nanometers. As seen in FIG. 2B, the thickness of the silicon nitride layer is preferably within the range of 700±30 nanometers in order to minimize the reflectance from the composite coating. More preferably, the range of thickness of the silicon nitride layer is in the range of 700±20 nanometers. As shown in FIGS. 2A, 2B, if the thicknesses of the layers 42, 44 are optimized, the reflectance at both 653 and 790 nanometers approach zero. The anti-reflective coatings therefore function as an anti-reflective filter which substantially filters out radiation at these two wavelengths.

While the antireflective coating comprising layers 42, 44 is described to comprise a silicon dioxide layer and a silicon nitride layer, two layers made of silicon material other than silicon nitride and silicon dioxide may be used instead and are within the scope of the invention. Such materials may include SOG-oxynitride, silicon-oxynitride and polyimide film. In other words, the two layers 42, 44 may be chosen from the group of materials including silicon dioxide, silicon nitride, SOG-oxynitride, silicon-oxynitride and polyimide film.

The thickness of the package layer 46 may also be optimized in a similar manner. As shown in FIG. 2C, where the total thickness of the composite layers 42, 44, 46 has been optimized at a value (e.g. 480,500 nanometers) that yields minimum reflectance, the reflectance can be minimized at both 653 and 790 nanometers wavelengths. In FIG. 2C, the two sinusoidal curves in solid lines illustrate the reflectances of the photodetector integrated circuit (PDIC) without antireflective coating at the two wavelengths 650 and 790 nanometers. These are labelled at the bottom of FIG. 2C as "NEB" (that is, no AR coating etchback). The two curves in dotted lines illustrate the reflectances of the photodetector integrated circuit (PDIC) with antireflective coating and are labelled as dotted lines at the bottom of FIG. 2C as "WEB" (with AR coating etchback).

FIG. 3A is a schematic diagram of six photodiodes suitable for use in CD-ROM and DVD-ROM optical pickup applications. As shown in FIG. 3A, the six photodetectors A, B, C, D, E, F, are located in the optical pickup head in the CD-ROM or DVD-ROM. FIG. 3B is a schematic view of an optical pickup configuration reading data from an optical media such as a disk to illustrate the invention. As shown in FIG. 3B, the optical pickup 50 suitable for use in CD-ROM and DVD-ROM applications contains a photodetector device such as device 20D shown in FIG. 1D, objective lenses 52, a quarter-wave plate 54, a polarizing prism 56 and a laser 58. Laser 58 supplies a laser beam 58a which is collimated by lens 52 to polarizing prism 56 and is altered in polarization by quarter-wave plate 54 and focused again by another objective lens 52 to the optical media such as a compact disk 59. The reflection from media 59 is collimated by objective lens 52 and altered again in polarization by plate 54 and reflected by polarization prism 56 and focused by another lens 52 to the photodetector device 20D. As shown in FIG. 3B, optical media 59 has tracks 59a thereon.

The two detectors E1/E2 and F1/F2 are for tracking purposes, that is, to ensure that the optical pickup head is in the right position relative to the data on a CD-ROM disk or DVD-ROM disk in order to read the data recorded thereon. Typically, the CD-ROM and DVD-ROM disks 59 have tracks 59a thereon and the two detectors E1/E2, F1/F2 are for ensuring that detectors A–D are in the right positions for reading the data relative to the tracks on the disk. If the detectors A–D are not in the right positions, tracking of the optical pickup is adjusted automatically by a servo system until they are in the right positions. The four detectors A, B, C, D are for reading the data; since it is arranged at a corners of a square, the four detectors are collectively known as a quad detector.

According to the CD-ROM and DVD-ROM specifications most commonly used, each of the four detectors A–D occupies a 50×50 micron area and the four detectors are separated by a spacing of about 5 or 10 microns both in the horizontal and vertical directions as shown in FIG. 3A.

In the conventional photodiode design as shown in FIG. 4E, the photodiode comprises a N+ region implanted in a P– epitaxial layer, so that a PN junction is formed between the N+ region and the P– region. The two regions form a junction which is reverse biased by a voltage supply VA. When the junction is so reverse biased, a depletion region 70 is formed largely in the P− region surrounding the N+ region as shown in FIG. 4E, where the depletion region 70 has a width Xd known also as the one-sided junction depletion width. When light impinges on the PN junction 52 as shown in FIG. 4E, electron-hole pairs are formed in the depletion region 70 and the electric field present in the depletion region causes drift of the electrons and holes, or carriers, to the P+ substrate and the N+ region, and then to the electrical contacts of the reverse biased voltage supply to the P+ substrate and the N+ region. The percentage of electrons and holes so formed that are able to travel to the P+ substrate and N+ region within the shortest time determines the bandwidth and responsivity of the photodiode. The higher the percentage, the greater is the responsivity. As noted above, it is desirable to increase such percentage so that the photodiode 52 will have a high responsivity.

The Applicant has recognized that two factors affect the percentage of electrons and holes that will be collected and transmitted as current through the contact points of the photodiode to an external processing circuit. The first factor involves the speed by which the carriers move or drift to these contact points, where such speed varies directly with the electric field strength over the paths of the carriers. In FIG. 4E, for example, the electrons that are formed will have to drift towards the N+ region and the holes will have the drift to the P+ substrate, and the electric field strength along such paths will affect the bandwidth. It should be noted that these paths are largely along directions normal to the surface of the integrated circuit. If the surface of the integrated circuit is in the XZ plane, then the paths are largely parallel to the Y-axis, so that the electric field that largely determines the drift velocity of the carriers is the electric field along the Y-axis.

The second factor affecting the percentage of carriers that will be collected and transmitted as current is the distance over which the carrier drift should occur. Thus, by increasing electric field strength and by reducing the distance along the paths that the electrons and holes must travel to reach such contact points, the bandwidth of the photodiode can be greatly enhanced.

FIGS. 4A–4D are cross-sectional views of four different embodiments of a PN junction where either the P or N type semiconductor material has a distributed configuration, to both reduce the distance traveled by the electrons and holes and to increase the electric field strength in the areas affecting the drift of the electrons and holes.

The photodiode 60 in FIG. 4A is formed by first growing a N− epitaxial layer on a N+ substrate, doping at two separate areas of the epitaxial layer so that two P+ regions 62a, 62b are formed that are adjacent to each other. Another N− epitaxial layer is grown on top of the structure so formed so that a buried PN junction results. The two P+ regions 62a, 62b are connected by a P+ connecting portion or an electrical conductor to form a single P+ region 62 so that a single PN junction is formed between the P+ region and the N− epitaxial layer. Thus, when a reverse bias is applied by a voltage source VA across the P+ and N− junction, a depletion region is formed in the N− epitaxial layer surrounding the P+ region as shown in FIG. 4A. The one-sided junction depletion width Xd is proportional to the square root of the amplitude of the voltage applied by the voltage source VA.

To increase the electric field in the depletion region and therefore the drift velocity of the carriers (electrons and holes), the distance between the two portions 62a, 62b of the P+ region is preferably not more than two times Xd. Where the spacing between the two portions 62a, 62b is within such range, the distances traveled by at least some of the carriers to the contact point are also reduced. Therefore, the distributed nature of the semiconductor material in region P+ increases the bandwidth and the responsivity of the photodiode 60 relative to the conventional photodiode design 52.

FIG. 4B is a cross-sectional view of a PN junction of a photodiode to illustrate another embodiment of the invention. In reference to FIGS. 4A, 4B, the photodiode 60' is different from photodiode 60 of FIG. 4A in that photodiode 60' is a surface junction whereas that of photodiode 60 is a buried junction. Thus, the surface junction 60' has no additional N− epitaxial layer grown on top of the P+ regions or on the original N− epitaxial layer, so that the contact between the voltage source and the P+ region may be formed directly. Again, the spacing between the two portions 62a', 62b' of the single P+ region 62' is not more than twice the one-sided junction depletion width. Preferably, the thickness of the N− epitaxial layer is in the range of about 10 to 15 microns to maximize the responsivity at 653 and 790 nm.

FIGS. 4C and 4D are similar to those of FIGS. 4A and 4B, respectively, except that the photodiodes in FIGS. 4C and 4D are formed starting with a P+ substrate, growing a P− epitaxial layer on the substrate, and by implanting dopants to form N+ doped regions in the epitaxial layer. The photodiode shown in FIG. 4C is a buried junction whereas that in FIG. 4D is a surface junction. In FIG. 4D, preferably, the thickness of the P− epitaxial layer is in the range of about 8 to 10 microns to maximize the responsivity at 653 and 790 nm.

The two portions 62a, 62b or 62a', 62b' of the integral P+ regions in FIGS. 4A and 4B and the corresponding two portions of the integral N+ regions in FIGS. 4C and 4D form two capacitive plates whose capacitance is inversely proportional to the distance or spacing between them. Since junction capacitive loading will limit the bandwidth response of the photodetector, it is undesirable for such spacing to be too small. Therefore, in the preferred embodiment, it is preferable for such spacing to be not less than Xd, the one-sided junction depletion width.

FIG. 5A is a graphical plot of an electric field profile of a structure such as that in FIGS. 4C and 4D that are reserve biased at 2.5 volts, where the amplitude of the electric field vector shown is the amplitude of the field in a direction perpendicular to the substrate. In the notation of FIG. 5A, the P+ substrate is in the XZ plane where the two N+ regions are spaced apart along the X axis. In the notation in FIG. 5A, "PSNSNSP=to 1-5-5-11-5-5-1" indicates that, along the X axis, going from left to right in the figure, one encounters a 1 micron P region separated by a 5 micron spacing to the next semiconductor region which is an N region of 5 microns wide which is separated from the next N region of 5 microns wide by a spacing which is 11 microns, where such next N region is separated by 5 microns from the next semiconductor P region of 1 micron in width, with dimensions all along the X axis.

FIG. 7A is a graphical plot of the electric field profile of a conventional photodiode structure such as that in FIG. 4E shown with the same convention as FIG. 5A. The PN junction illustrated in FIG. 7A is also reverse biased at 2.5 volts. In reference to FIGS. 5A and 7A, it will be seen that the electric field has significant strength in a much higher percentage of the space around the PN junction in FIG. 5A compared to that in FIG. 7A.

FIG. 5B illustrates the effects on the electric field profile by causing the two distributed N+ portions of the single N+ region to be much closer together than that shown in FIG. 5A. As shown in FIG. 5B, the two portions are at the spacing of 5 microns apart, so that the electric field in the region between the two portions is much more intense compared to that shown in FIG. 5A. For both profiles in FIGS. 5A and 5B, a much higher percentage of the space at or around the PN junctions is at high electric field strengths compared to that in FIG. 7A. The junction in FIG. 5B is reverse biased at 1.4 volts. The electric field profile resulting from a conventional photodiode design such as that in FIG. 4E reverse biased at 1.4 volts as shown in FIG. 7B.

The Applicant also recognized that, by including a heavily doped region between the two portions of the distributed semiconductor material forming one side of the junction, the electric field amplitude can be further enhanced, such as by adding a heavily doped P+ region between the two N+ portions in the structures in FIGS. 4C, 4D, or by adding a heavily doped P+ region between the two N+ portions in the structures in FIGS. 4A, 4B. This is illustrated in FIGS. 6A–6C. In the structure illustrated in FIG. 6A, a P+ region having a width of 1 micron along the X axis is included half way between the two N+ regions, where the P+ region is spaced 5 microns from each of the two N+ portions. In other words, the PN junction illustrated in FIG. 6A is the same as the junction in FIG. 5A, except that an additional P+ region of 1 micron is added midway between the two N+ portions. As compared to the electric field profile in FIG. 5A, the electric field profile in FIG. 6A has a much higher electric field amplitude in the region between the two N+ portions. The additional P+ region of 1 micron is biased (not shown) at the same voltage as the P– epitaxial layer and the P+ substrate in the configurations of FIGS. 4C, 4D. Similarly, where an additional N+ region is added midway between the two P+ portions in the configurations of FIGS. 4A, 4B, the additional N+ region is biased (not shown) at the same voltage as the N– epitaxial layer and the N+ substrate.

In FIG. 6A, the PN junction is reserved biased at 2.5 volts. A similar electric field profile for the same junction as that illustrated in FIG. 6A but reverse biased at 1.4 volts instead of 2.5 volts is illustrated in FIG. 6B. FIG. 6C is a graphical illustration of the electric field profile resulting from reverse biasing a PN junction similar to that illustrated in FIG. 5B, but where an additional P+ region 3 microns wide along the X direction is included between the two N+ portions. As can be seen from a comparison between FIGS. 6C and 5B, the additional heavily doped region between the two portions further enhances the amplitude of the electric field around the PN junction.

FIG. 8A is a cross-sectional view of a quad detector comprising detectors A, B, C, D to illustrate one embodiment of the invention. As shown in FIG. 8A, each of the four detectors A–D comprises five strips 102 of N+ regions connected at one end by a metal contact 106. Even though the five strips are not connected together by the same N+ material, the fact that they are connected together by metal means that the five strips will be at the same electrical potential and therefore function as a common node in the semiconductor region in the PN junction in such photodiode. The five strips of N+ material 102 are formed in the P– epitaxial layer, where between each pair of strips 102 is a narrow strip of P+ material 104 for enhancing the electric field between the strips. To facilitate the integrated circuit design, a single cell element may be laid out such as that shown in FIG. 8B and then repeated five times for each of the four photodetectors A–D. Of course, it is also possible to employ instead five strips of P+ material are formed in an N– epitaxial layer, where between each pair of strips is a narrow strip of N+ material for enhancing the electric field between the strips.

As shown in FIG. 8A, for CD-ROM and DVD-ROM applications, each of the four photodetectors A–D is 50×50 microns square. Since the five strips of N+ (or P+) material 102 are connected by metal at one end, the five strips may be regarded as a single N+ (or P+) region having five distributed portions. Another aspect of the invention is based on the recognition that, for CD-ROM and DVD-ROM applications, any two portions in the distributed structure of one type of semiconductor material forming one side of the PN junction in the photodiode are spaced apart by a spacing in the range of about 5 to 15 microns. When the spacing between adjacent portions of the single region is in such range, it is likely that the electric field strength is optimized.

FIG. 9A is a cross-sectional view of a distributed structure for one of the four detectors A–D in FIG. 3A to illustrate another embodiment of the invention. As shown in FIG. 9A, the distributed structure may comprise two sets of three cross-shaped elements 112, where each set of three elements are connected together and to a common metal contact (not shown) to form a single N+ region. The two sets are separated by a distance less than twice the one-sided junction depletion width and by a spacing in the range of 5 to 15 microns. A heavily doped P+ region 114 may be added between the two sets to further enhance the electric field strength in the space between the two sets of N+ portions. FIG. 9B is a schematic view of a single cell element which may be repeated six times for the design of the photodetector of FIG. 9A.

FIG. 10A is a cross-sectional view of a photodetector which may be used for any one of the four detectors A–D of FIG. 3A. As shown in FIG. 10A, the N+ region comprises six circular or cylindrical portions 122 connected together by means of abutting N+ connecting portions 122a and at one end to an N+ contact 126. Again, a single cell design omitting the connecting portion 122a is shown in FIG. 10B. As before, P+ strips 124 may be included to enhance the electric field strength.

FIG. 11 is a cross-sectional view of a quad detector (A, B, C, D) of FIG. 3A to illustrate yet another embodiment of the invention. As shown in FIG. 11A, each of the four detectors A–D comprises a single N+ region with ten fingers; five at the top and five at the bottom, where each pair of adjacent fingers are separated by a spacing which is in the range of Xd to 2Xd in the preferred embodiment, and preferably in the range of about 5 to 15 microns. Between each pair of adjacent fingers is preferably a P+ region to enhance the electric field between the fingers. FIG. 11B is a schematic diagram of a single cell which may be repeated five times in each detector for the design of the quad detector. In each of the designs of FIGS. 8A–11B, the N and the P type materials may be reversed in their roles, so that P+ and N+ regions are formed in an N– epitaxial layer which has been grown from an N+ substrate.

FIGS. 12–19 are cross-sectional views of semiconductor substrates to show the processing steps for fabricating CMOS devices and a photodetector in the same semiconductor substrate, where a Vth implantation is performed on the portion of the substrate for the CMOS devices but shielded from the region of the substrate for the photodetector to illustrate the invention. FIG. 12 is a cross sectional view of a semiconductor substrate 200 comprising an N+ substrate 202, a layer of N-epitaxial layer 204 and an oxide layer 206. As also shown in FIG. 12, a NWell mask and photoresist are employed for an NWell implant, FIG. 13 is a cross-sectional view of the substrate 200 and PWell mask and photoresist for a PWell implant, and the resulting semiconductor substrate 200' with the resulting PWell and NWell implants is as shown in FIG. 14. As also shown in FIG. 14, a layer of silicon nitride 208 is formed on top of the silicon dioxide layer 206. An active mask to define the nitride layer and a PWell mask for a P field implant are employed as shown in FIGS. 14 and 15 to define the silicon nitride layer and to perform a P field implant.

A photodiode active mask 220 is employed to shield a portion 204a of the N-epitaxial layer 204, in which the photodiode is to be fabricated. The mask 220 shields only the region 204a of the substrate 200'' where the photodiode is to be fabricated: the Vth implantation is performed preferably on the remainder of the substrate in which CMOS devices are to be fabricated as shown in FIG. 16. The Vth implant is performed to adjust the threshold voltage of the CMOS devices. Such shielding of the region 204a will prevent the Vth implant from affecting the photodetector that will be formed in the region. Thereafter, the photodiode is fabricated in region 204a by a PDP+ implant and PDPN+ implant as shown in FIGS. 17 and 18. As shown in FIG. 19, a gate polysilicon layer 230 is formed on the silicon dioxide layer 206, and a polysilicon layer 236 is also formed on the field oxide region 234. Preferably layers 230 and 236 are formed in the same processing step by means of a poly 1 mask 232. While in the preferred embodiment, the polysilicon layer on the field oxide 234 is formed in the same processing step as the gate oxide on the silicon dioxide layer 206, this is not required; in other words, the polysilicon layer on the field oxide region 234 may be formed in a separate processing step employing a different mask from the gate or polysilicon layer on the silicon dioxide layer 206. As described below, this polysilicon layer 236 forms the bottom plate of a capacitor 260.

Another silicon dioxide layer is deposited on top of the structure in FIG. 19 to form the poly 1/poly 2 oxide and gate oxide layer 242 as shown in FIG. 20; this layer 242 includes the layer 206 and the additional silicon dioxide that is deposited on top of the structure in FIG. 19. As illustrated in FIGS. 20 and 21, a second polysilicon layer 244 is then formed on top of the dioxide layer 242 and a poly 2 mask 246 is employed in order to fabricate the poly 2 mask 248, the poly 2 resister 250 and the top portion 252 of the capacitor 260 which comprises the polysilicon layer 236 formed as described above, the polysilicon layer 252, and a layer of silicon dioxide between the layers 236 and 252, where such dioxide layer is deposited as described above in reference to FIG. 20.

NLDD, PLDD implants are then performed as indicated in FIGS. 22 and 23 and N+ S/D and P+ S/D implants are performed as indicated in FIGS. 24 and 25A. Three metal layers M1, M2, M3 and vias 1 and 2 for contacts are then formed as indicated in FIG. 25B and the antireflective (AR) coating etchback is formed as indicated in FIG. 25C. The AR coating etchback process indicated in FIG. 25C is illustrated in more detail in FIGS. 26A–26D. Thus, after the metal and intermetal layers are formed, a cross-sectional view of the semiconductor substrate 200''' is illustrated in FIG. 26A. Substrate 200''' has a silicon dioxide layer 272 above the polysilicon mask layer 248, and an additional oxide layer 274 above the dioxide layer 272 during the formation of the different metal layers. A PD mask 276 and photoresist 278 are employed to etch layers 272, 274, using the polysilicon mask layer 248 as an etch stop, as illustrated in FIG. 26B. Shown more clearly in FIG. 20 is the poly 1/poly 2 silicon dioxide layer 242 between the polysilicon layer 248 and region 204a where the photodiode is formed. The polysilicon layer 248 is removed, resulting in the structure shown in FIG. 26C. As noted above, since the initial silicon dioxide layer 206 and the layer of silicon dioxide deposited on top of layer 206 to form a combined silicon dioxide layer 242 are both well controlled, the thickness of the silicon dioxide layer 242 is well controlled. As illustrated in FIG. 26D, another silicon dioxide layer is deposited on top of the entire structure of FIG. 26C. The silicon dioxide deposited on the dioxide layer 242 on top of the photodetector region 204a bonds well to layer 242 since the polysilicon layer 248 preserves the integrity of the surface of layer 242 during the etch back process illustrated in FIG. 26B. The layer of silicon dioxide deposited on the structure of FIG. 26C together with layer 242 form a combined layer 292 of silicon dioxide as shown in FIG. 26D. A layer of silicon nitride 284 is then deposited on top of the silicon dioxide layer 282 to form the antireflective coating. In this manner, the total thickness of the silicon dioxide layer 282 and of the silicon layer 284 can be well-controlled to the desired thicknesses to minimize the amount of radiation reflected by the interfaces between layers 282, 284 and region 204a. The range of optimal thicknesses of the layers 282, 284 and of any packaging layer on top of these layers are explained above.

As noted above, preferably the polysilicon layer forming the lower plate 236 of the capacitor 260 is formed together with the gate polysilicon layer 230 and the top polysilicon plate 252 of the capacitor 260 is formed together with the mask 248. Preferably, in reference to FIG. 16, the Vth implant process is performed during the formation of the CMOS devices prior to the formation of the photodetector in region 204a as illustrated in FIGS. 16–19.

While the invention has been described above by reference to various embodiments, it will be understood that changes and modifications may be made without departing from the scope of the invention, which is to be defined only by the appended claims and their equivalents.

What is claimed is:

1. A method for making a photodetector comprising:

providing a structure having a photosensitive region on or in a semiconductor substrate, a masking layer over said region and a material over said masking layer;

removing from said structure the material over said masking layer using said masking layer as a mask;

removing said masking layer; and forming a first layer of silicon nitride and a second layer of dielectric material contiguous with the first layer over said region, the second layer having a predetermined thickness.

2. The method of claim 1, wherein said forming forms the first and second layers over substantially the entire photosensitive region.

3. The method of claim 1, wherein said providing provides a structure having a polysilicon layer over the substrate, a portion of said polysilicon layer being the masking layer.

4. The method of claim 1, wherein said providing means provides a CMOS structure having a polysilicon gate layer over the substrate, and comprises forming said masking layer together with the polysilicon gate layer.

5. The method of claim 1, wherein said providing provides a CMOS structure having a polysilicon gate layer and a capacitor over the substrate, said capacitor comprising a first and a second polysilicon layer, and wherein said providing comprises forming said masking layer together with the first or the second polysilicon layer or together with the polysilicon gate layer.

6. The method of claim 5, wherein the polysilicon gate layer and said first polysilicon layer are formed together, and said masking layer and said second polysilicon layer are formed therein.

7. The method of claim 1, said region comprising a PN junction, wherein said forming forms the second layer in contact with the junction to reduce leakage current.

8. The method of claim 1, wherein said forming forms said first and second layer so that said first layer has a thickness in the range of 7000±500 Angstroms, and said second layer has a thickness in the range of 2400 to 2850 Angstroms.

9. The method of claim 1, wherein said forming forms the second layer so that the second layer includes a silicon dioxide layer.

* * * * *